United States Patent
Pflumm et al.

(10) Patent No.: US 11,631,816 B2
(45) Date of Patent: Apr. 18, 2023

(54) ELECTRONIC DEVICE

(71) Applicant: Merck Patent GmbH, Darmstadt (DE)

(72) Inventors: Christof Pflumm, Darmstadt (DE); Frank Voges, Bad Duerkheim (DE); Jonas Valentin Kroeber, Frankfurt am Main (DE); Philipp Stoessel, Frankfurt am Main (DE); Holger Heil, Frankfurt am Main (DE)

(73) Assignee: MERCK PATENT GMBH, Darmstadt (DE)

( * ) Notice: Subject to any disclaimer, the term of this patent is extended or adjusted under 35 U.S.C. 154(b) by 241 days.

(21) Appl. No.: 14/758,904

(22) PCT Filed: Dec. 9, 2013

(86) PCT No.: PCT/EP2013/003717
§ 371 (c)(1),
(2) Date: Jul. 1, 2015

(87) PCT Pub. No.: WO2014/106523
PCT Pub. Date: Jul. 10, 2014

(65) Prior Publication Data
US 2015/0340619 A1  Nov. 26, 2015

(30) Foreign Application Priority Data
Jan. 3, 2013 (EP) ................................... 13000014

(51) Int. Cl.
| | | |
|---|---|---|
| *H01L 51/00* | (2006.01) | |
| *C09K 11/06* | (2006.01) | |
| *H05B 33/14* | (2006.01) | |
| *H01L 51/50* | (2006.01) | |

(52) U.S. Cl.
CPC .......... *H01L 51/0056* (2013.01); *C09K 11/06* (2013.01); *H01L 51/006* (2013.01); *H01L 51/0071* (2013.01); *H01L 51/0072* (2013.01); *H05B 33/14* (2013.01); *H01L 51/0067* (2013.01); *H01L 51/0073* (2013.01); *H01L 51/0074* (2013.01); *H01L 51/5012* (2013.01); *H01L 51/5056* (2013.01); *H01L 2251/5384* (2013.01); *Y02E 10/549* (2013.01); *Y02P 70/50* (2015.11)

(58) Field of Classification Search
CPC combination set(s) only.
See application file for complete search history.

(56) References Cited

U.S. PATENT DOCUMENTS

| | | | | |
|---|---|---|---|---|
| 3,658,520 A | * | 4/1972 | Brantly ................ | G03G 5/0618 430/73 |
| 4,769,292 A | * | 9/1988 | Tang ................... | H01L 51/0064 313/504 |
| 8,877,350 B2 | | 11/2014 | Spinkier et al. | |
| 9,312,495 B2 | | 4/2016 | Pflumm et al. | |
| 2004/0076853 A1 | * | 4/2004 | Jarikov ................. | C09K 11/06 428/690 |
| 2007/0275266 A1 | * | 11/2007 | Jinde ................... | H01L 51/5036 428/690 |
| 2008/0079356 A1 | * | 4/2008 | Park ...................... | H05B 33/14 313/504 |
| 2009/0146552 A1 | | 6/2009 | Spindler et al. | |
| 2010/0019658 A1 | * | 1/2010 | Lin ........................ | H01J 29/20 313/504 |
| 2010/0187505 A1 | * | 7/2010 | Stoessel ................. | C07C 39/12 257/40 |
| 2011/0018429 A1 | | 1/2011 | Spindler et al. | |
| 2011/0193074 A1 | * | 8/2011 | Lee ...................... | H01L 51/0072 546/276.7 |
| 2012/0187826 A1 | | 7/2012 | Kawamura et al. | |
| 2012/0248426 A1 | * | 10/2012 | Kato .................... | C07D 209/86 257/40 |
| 2015/0340636 A1 | * | 11/2015 | Kroeber ................ | C09K 11/06 257/40 |

FOREIGN PATENT DOCUMENTS

| | | |
|---|---|---|
| JP | 2011508368 A | 3/2011 |
| WO | WO-2005/020283 A2 | 3/2005 |
| WO | WO-2006/117052 A1 | 11/2006 |
| WO | 2011011501 A1 | 1/2011 |
| WO | 2012034627 A1 | 3/2012 |

OTHER PUBLICATIONS

Kwon, J et al. 4,4',4"-Tris(4-naphthalen-1-yl-phenyl)amine as a multifunctional material for organic light-emitting diodes, organic solar cells, and organic thin-film transistors, Org. Electron., 11, 2010, pp. 1288-1295.*
International Search Report for International Application No. PCT/EP2013/03717; Application Filing Date Dec. 9, 2013.
Translation of Japanese Office Action for Japanese Application No. 2015-551136, dated Oct. 3, 2017, 6 pages.

* cited by examiner

*Primary Examiner* — Sean M DeGuire
(74) *Attorney, Agent, or Firm* — Faegre Drinker Biddle & Reath LLP

(57) ABSTRACT

The present application relates to an electronic device having defined composition of the emitting layer. The application furthermore relates to the use of the device in displays or in lighting applications.

11 Claims, No Drawings

ELECTRONIC DEVICE

RELATED APPLICATIONS

This application is a national stage entry, filed pursuant to 35 U.S.C., § 371, of PCT/EP2013/003717, filed Dec. 9, 2013, which claims the benefit of European Patent Application No. 13000014.4, filed Jan. 3, 2013, which is incorporated herein by reference in its entirety.

The present invention relates to an electronic device which comprises an emitting layer having a defined composition of various compounds.

Electronic devices in the sense of this application are taken to mean, in particular, so-called organic electronic devices, which comprise organic semiconductor materials as functional materials. Again in particular, they are taken to mean organic electroluminescent devices (OLEDs) and other electronic devices which are indicated below.

The structure of OLEDs in which organic semiconductors are employed as functional materials is described, for example, in U.S. Pat. Nos. 4,539,507, 5,151,629, EP 0676461 and WO 98/27136. In general, the term OLED is taken to mean electronic devices which comprise organic material and emit light on application of an electrical voltage.

In the case of electronic devices, in particular OLEDs, there is major interest in improving the performance data, in particular lifetime and efficiency.

In both respects, an entirely satisfactory solution has still not been found, in particular in the case of blue-emitting OLEDs.

In order to achieve further advances in these points, particular attention is being paid to the composition of the emitting layer.

It has already long been known in the prior art that the efficiency of an OLED can be significantly increased through the use of more than one single compound in the emitting layer. Specifically, a dopant compound is employed in the emitting layer in this technical solution in combination with a second compound which serves as matrix compound, i.e. is present in predominant proportion. Such embodiments have been described for fluorescent emitting layers, inter alia in U.S. Pat. No. 4,769,292, U.S. Pat. No. 5,908,581, U.S. Pat. No. 5,593,788 and U.S. Pat. No. 5,141,671.

Furthermore, some publications describe the use of three different compounds in the emitting layer of an OLED.

For example, EP 1227527 discloses an OLED comprising the two compounds tris-(8-hydroxyquinoline)aluminium (Alq3) and N,N'-di-1-naphthyl-N,N'-diphenyl-1,1'-biphenyl-4,4'-diamine (NPB) as host materials and rubrene as dopant.

Furthermore, U.S. Pat. No. 7,504,163 discloses an OLED comprising an anthracene derivative (2-tertbutyl-9,10-bis(2-naphthalenyl)anthracene) as host material, a boron complex or a perylene derivative as dopant, and 1-5% of NPB as further component. Increased efficiency was thereby achieved compared with an OLED which does not comprise NPB as further component of the emitting layer.

However, there continues to be interest in OLEDs which have increased efficiency and long lifetime, in particular in blue-fluorescent OLEDs having these properties.

In the context of the present invention, it has surprisingly been found that the efficiency and lifetime of the device can be increased through the use of a triarylmonoamine in an emitting layer comprising a dopant and a matrix material containing at least one anthracene unit or at least one pyrene unit.

Furthermore, the monoamines used are simple to prepare and purify and are thus economically favourable.

The present application thus relates to an electronic device comprising anode, cathode, and at least one emitting layer, where the emitting layer comprises at least one dopant D, at least one matrix material M1 and at least one matrix material M2, where D, M1 and M2 are selected differently and where M1 is selected from monotriarylamines and M2 is selected from compounds containing at least one anthracene unit or from compounds containing at least one pyrene unit.

The electronic device according to the invention has the advantage that it has a long operating lifetime. It furthermore has high power efficiency.

Again furthermore, it has high colour purity, in particular in the case of blue emission.

For the purposes of this application, a monotriarylamine is taken to mean a compound which contains a single triarylamine group. A triarylamine group is a group in which three aromatic or heteroaromatic ring systems are bonded to a common nitrogen atom. A monotriarylamine compound preferably contains no further arylamino group. A monotriarylamine compound particularly preferably contains no further amino group.

The matrix material M1 is preferably selected from monotriarylamine compounds in which three aromatic ring systems are bonded to a common nitrogen atom. The aromatic ring systems preferably have 6 to 50 aromatic ring atoms and may be substituted or unsubstituted. They preferably contain no amino group as substituent. Furthermore, M1 preferably contains no condensed aryl group having more than 14 aromatic ring atoms, particularly preferably no condensed aryl group having more than 10 aromatic ring atoms. Furthermore, M1 preferably contains no condensed heteroaryl group having more than 14 aromatic ring atoms, particularly preferably no condensed heteroaryl group having more than 10 aromatic ring atoms.

A condensed aryl group here is taken to mean an aryl group which contains two or more aromatic rings which are condensed with one another, i.e. share one or more aromatic bonds with one another. A corresponding definition applies to heteroaryl groups. Examples of condensed aryl groups are naphthyl, anthracenyl, pyrenyl, phenanthrenyl and perylenyl. Examples of condensed heteroaryl groups are quinolinyl, indolyl, carbazolyl, and acridinyl.

M1 is particularly preferably selected from compounds of the formula (I)

formula (I)

where:
Ar$^1$ is on each occurrence, identically or differently, an aromatic or heteroaromatic ring system having 5 to 50 aromatic ring atoms, which may be substituted by one or more radicals R$^1$; and
R$^1$ is on each occurrence, identically or differently, H, D, F, C(=O)R$^2$, CN, Si(R$^2$)$_3$, P(=O)(R$^2$)$_2$, S(=O)R$^2$, S(=O)$_2$R$^2$, a straight-chain alkyl or alkoxy group having 1 to 20 C atoms or a branched or cyclic alkyl or alkoxy group having 3 to 20 C atoms or an alkenyl or alkynyl group having 2 to 20 C atoms, where the above-mentioned groups may each be substituted by one or more radicals R² and where one or more CH₂ groups in the above-mentioned groups may be replaced by —R²C=CR²—, —C≡C—, Si(R²)₂, C=O, C=S, C=NR², —C(=O)O—, —C(=O)NR²—, P(=O)(R²), —O—, —S—, SO or SO₂ and where one or more H atoms in the above-mentioned groups may be replaced by D, F or CN, or an aromatic or heteroaromatic ring system having 5 to 30 aromatic ring atoms, which may in each case be substituted by one or more radicals R², or an aryloxy or heteroaryloxy group having 5 to 30 aromatic ring atoms, which may be substituted by one or more radicals R², where two or more radicals R¹ may be linked to one another and may form a ring;

R² is on each occurrence, identically or differently, H, D, F or an aliphatic, aromatic or heteroaromatic organic radical having 1 to 20 C atoms, in which, in addition, one or more H atoms may be replaced by D or F; two or more substituents R² here may be linked to one another and may form a ring.

Ar¹ is preferably an aromatic ring system having 6 to 30 aromatic ring atoms, which may be substituted by one or more radicals R¹. Ar¹ particularly preferably contains a group selected from fluorene, indenofluorene, spirobifluorene, phenyl, biphenyl, terphenyl or naphthyl, each of which is substituted by R¹ or unsubstituted.

Ar¹ furthermore preferably contains no condensed aryl group having more than 14 aromatic ring atoms, Ar¹ particularly preferably contains no condensed aryl group having more than 10 aromatic ring atoms.

Ar¹ furthermore preferably contains no condensed heteroaryl group having more than 14 aromatic ring atoms, Ar¹ particularly preferably contains no condensed heteroaryl group having more than 10 aromatic ring atoms.

M1 is preferably selected from compounds of the formulae (I-1) to (I-6)

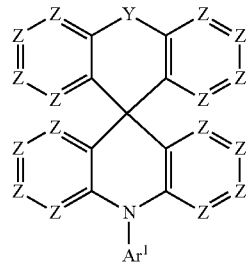

(formula I-1)

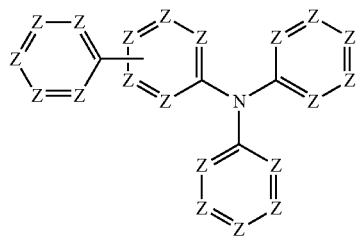

(formula I-2)

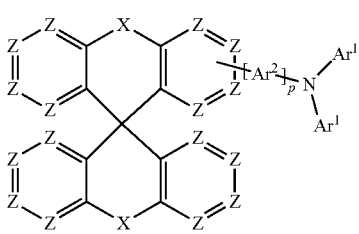

(formula I-3)

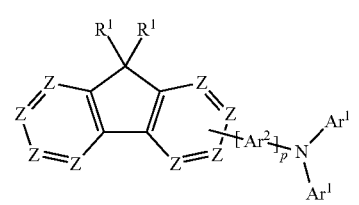

(formula I-4)

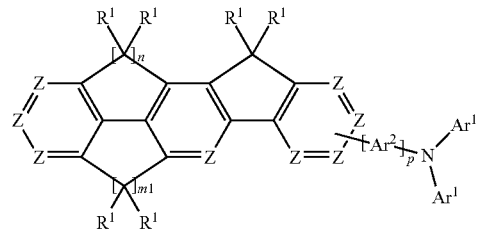

(formula I-5)

(formula I-6)

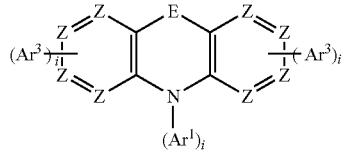

where:

Z is on each occurrence, identically or differently, N or CR¹, where Z is equal to C if a substituent is bonded;

X is on each occurrence, identically or differently, a single bond, O, S, Se, BR¹, C(R¹)₂, Si(R¹)₂, NR¹, PR¹, C(R¹)₂—C(R¹)₂, or CR¹=CR¹;

Y is a single bond, O, S, Se, BR¹, C(R¹)₂, Si(R¹)₂, NR¹, PR¹, C(R¹)₂—C(R¹)₂, or CR¹=CR¹;

E is O, S, Se, BR¹, C(R¹)₂, Si(R¹)₂, NR¹, PR¹, C(R¹)₂—C(R¹)₂, or CR¹=CR¹;

Ar¹ is defined as above;

Ar², Ar³ is an aromatic or heteroaromatic ring system having 6 to 18 aromatic ring atoms, which may be substituted by one or more radicals R¹;

R¹, R² are defined as above;

i is on each occurrence, identically or differently, 0 or 1, where the sum of all i is at least equal to 1;

p is equal to 0 or 1;

m, n are, identically or differently, 0 or 1, where the sum of m and n is equal to 1 or 2.

For the above-mentioned formulae (I-1) to (I-6), it is preferred for not more than three groups Z in a ring to be equal to N. It is generally preferred for Z to be equal to CR¹.

The group X is selected on each occurrence, preferably identically or differently, from a single bond, C(R¹)₂, O and S, it is particularly preferably a single bond.

The group Y is preferably selected from O and C(R¹)₂, it is particularly preferably O.

The group E is preferably selected from C(R¹)₂, O and S, it is particularly preferably C(R¹)₂.

The group Ar¹ is preferably selected on each occurrence, identically or differently, from aromatic or heteroaromatic ring systems having 6 to 30 aromatic ring atoms, which may be substituted by one or more radicals R¹. Ar¹ is particularly preferably selected from aryl or heteroaryl groups having 6 to 18 aromatic ring atoms, which may be substituted by one or more radicals R¹.

R¹ is preferably on each occurrence, identically or differently, H, D, F, CN, $Si(R^3)_3$, a straight-chain alkyl or alkoxy group having 1 to 20 C atoms or a branched or cyclic alkyl or alkoxy group having 3 to 20 C atoms, where the above-mentioned groups may each be substituted by one or more radicals R³ and where one or more $CH_2$ groups in the above-mentioned groups may be replaced by —C≡C—, —R³C=CR³—, $Si(R^3)_2$, C=O, C=NR³, —O—, —S—, —C(=O)O— or —C(=O)NR³—, or an aromatic or heteroaromatic ring system having 5 to 20 aromatic ring atoms, which may in each case be substituted by one or more radicals R², where two or more radicals R¹ may be linked to one another and may form a ring.

Examples of compounds which are employed as matrix material M1 in the electronic device according to the invention are shown below:

1

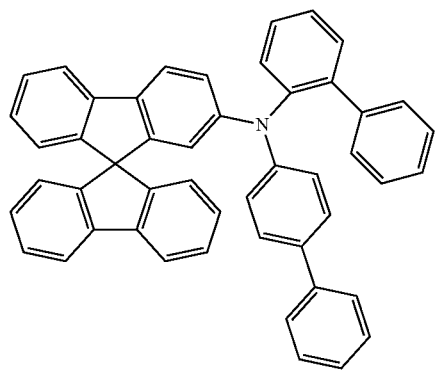

2

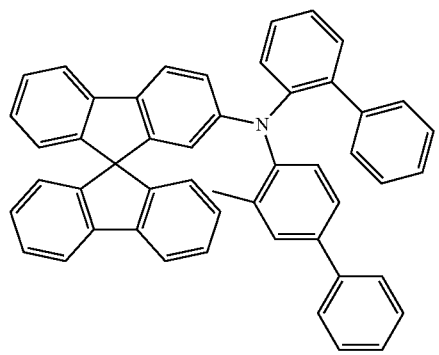

3

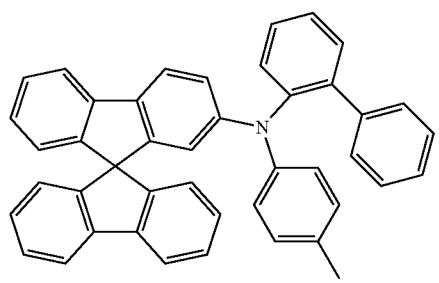

4

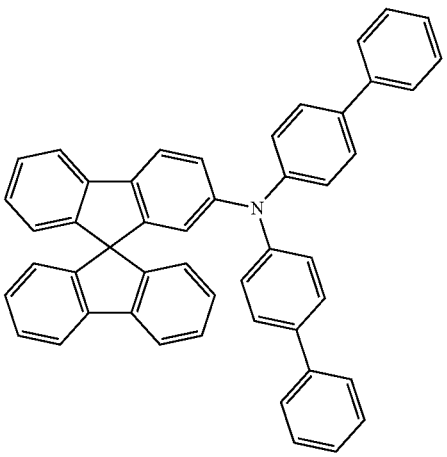

5

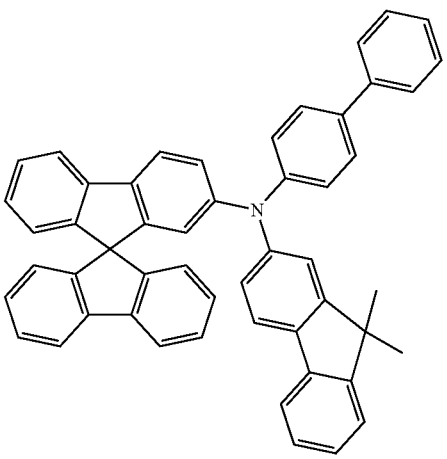

6

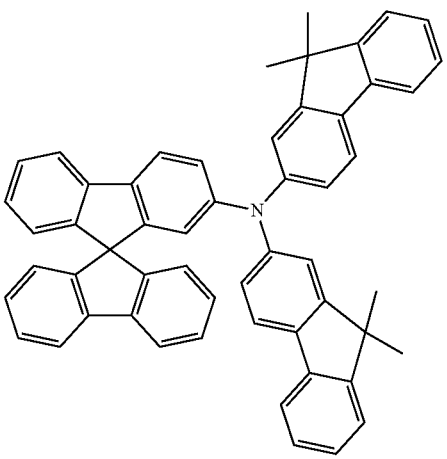

7
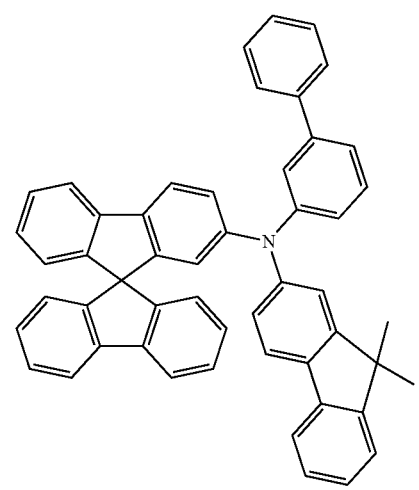
8
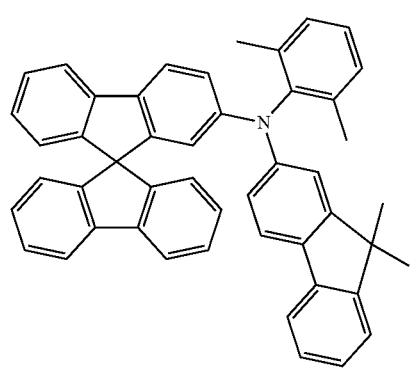
9
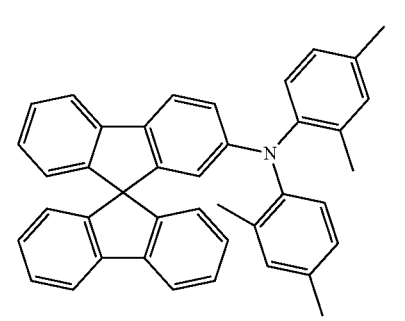
10
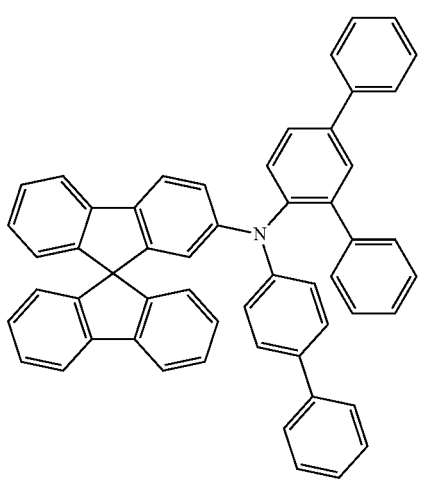
11
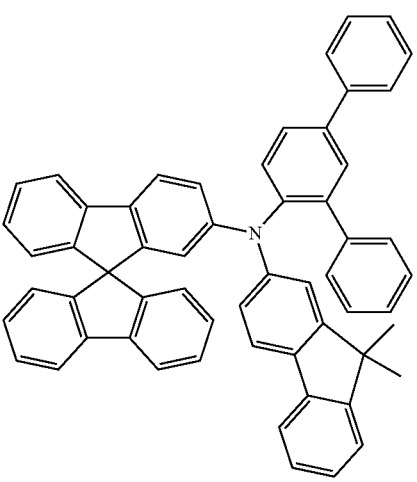
12
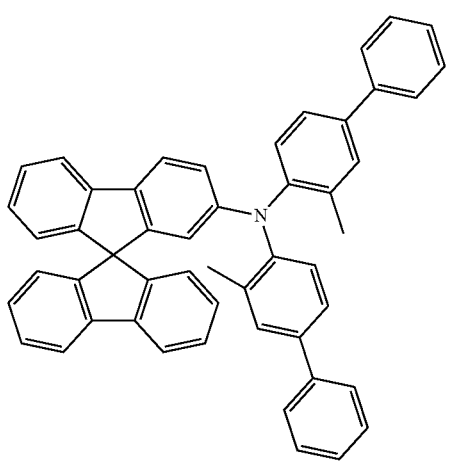
13
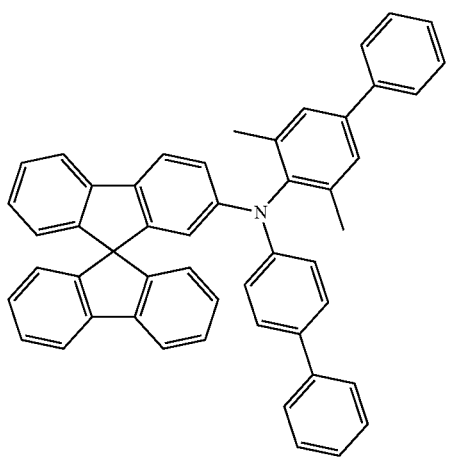

14
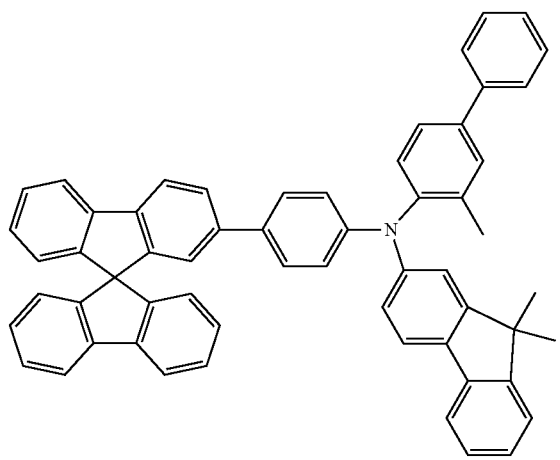
15
17
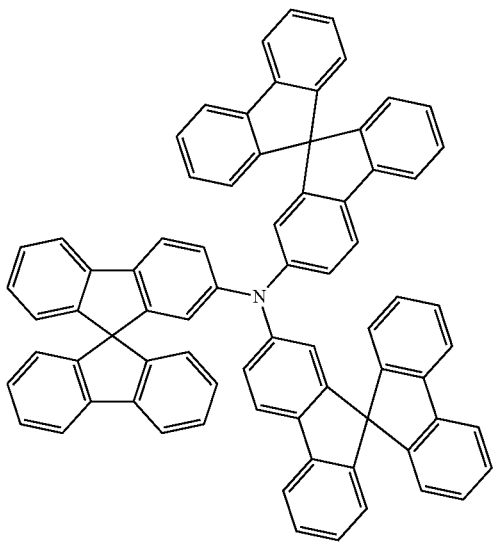
18
16
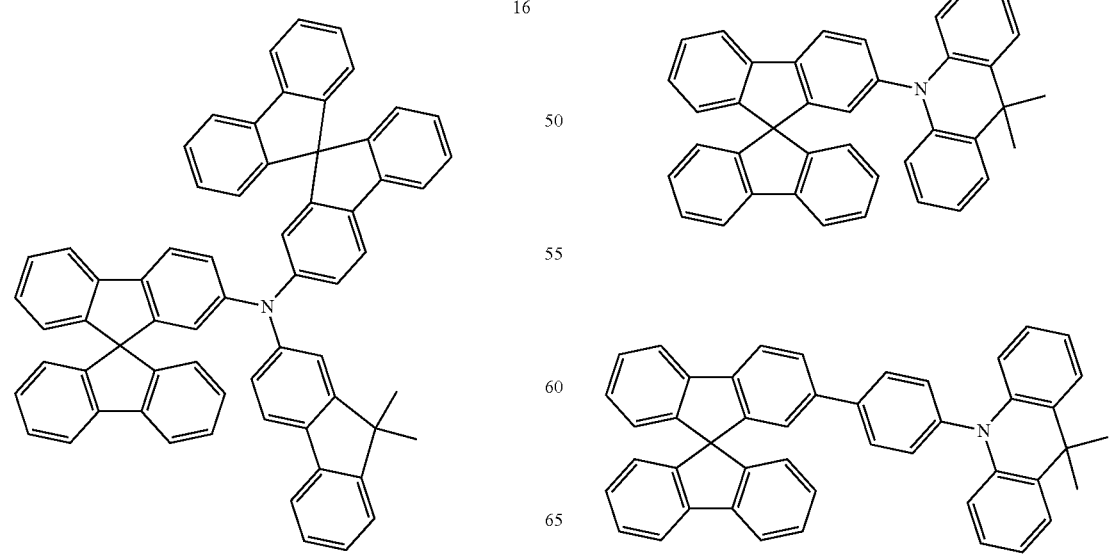
19
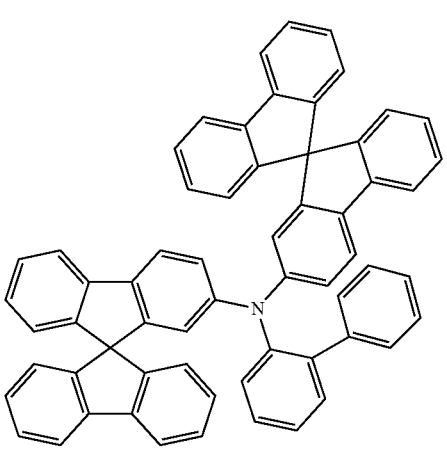
20
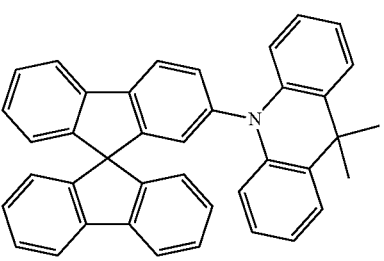

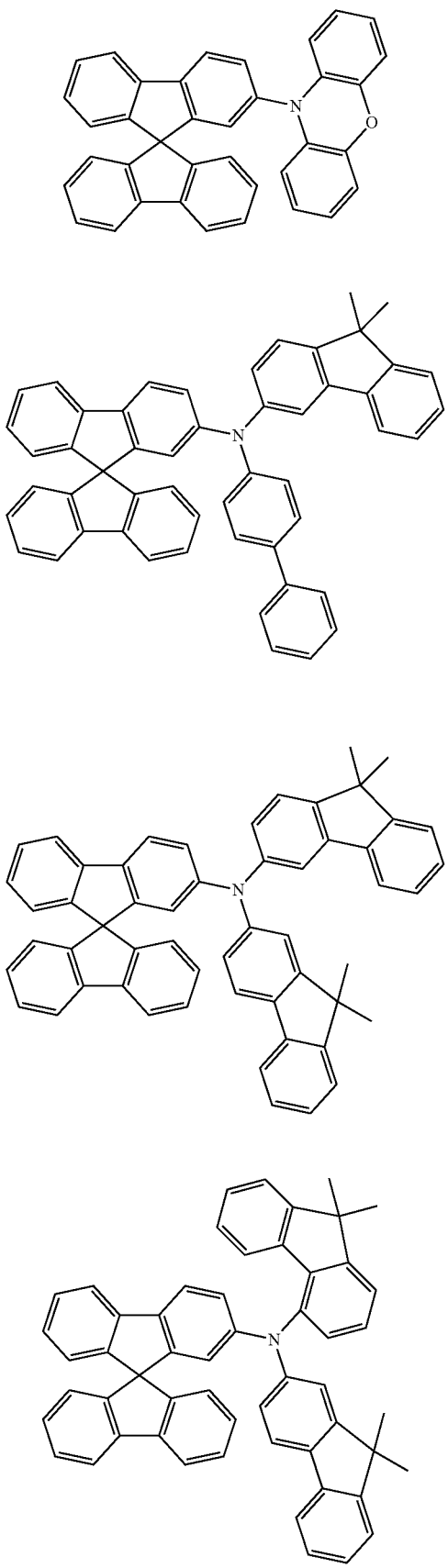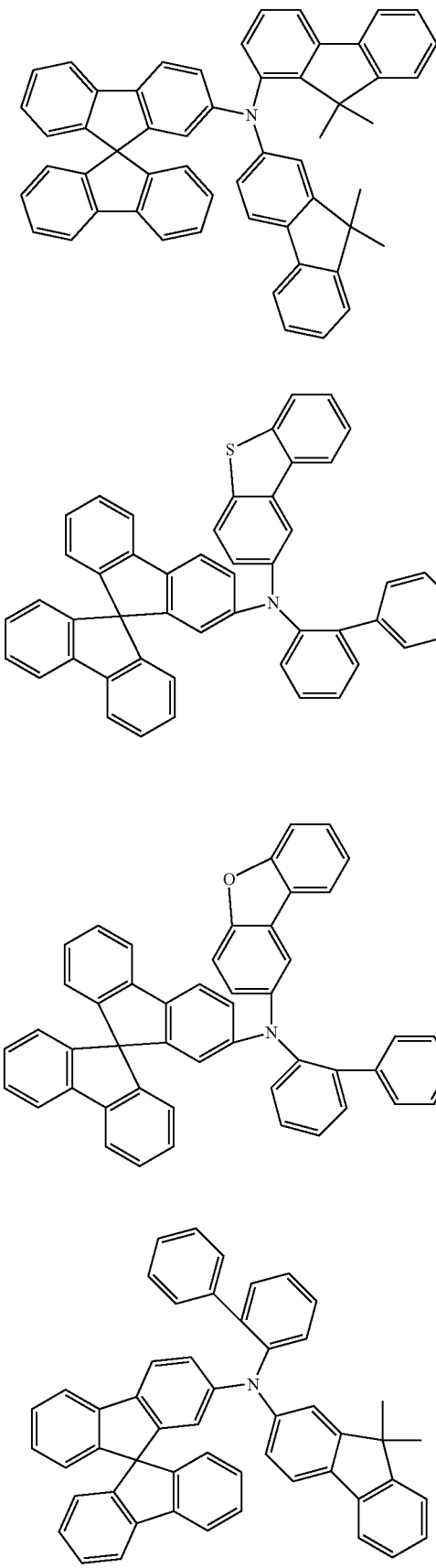

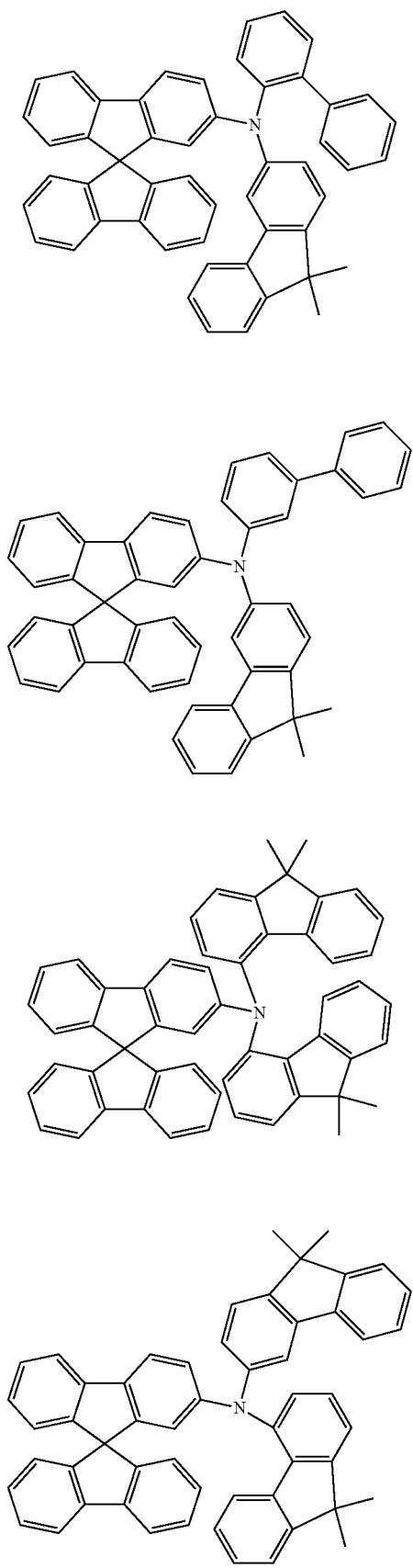
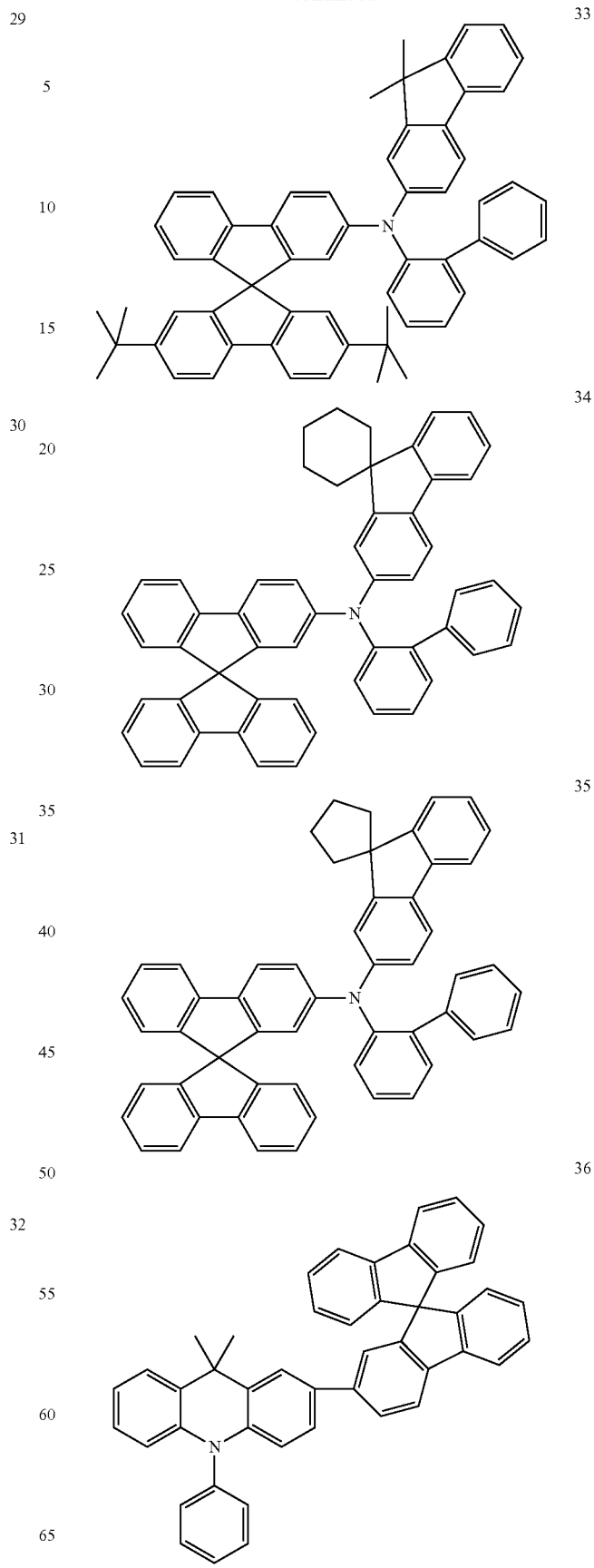

37
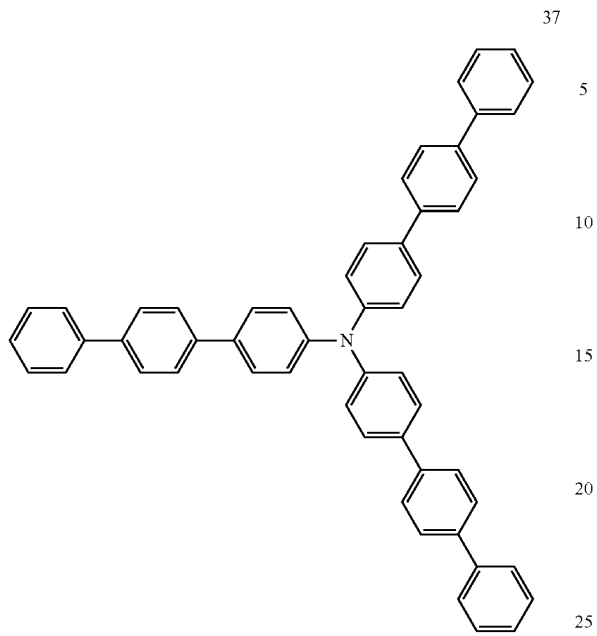
38
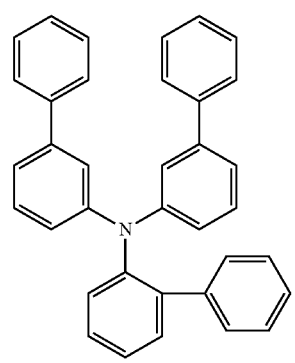
39
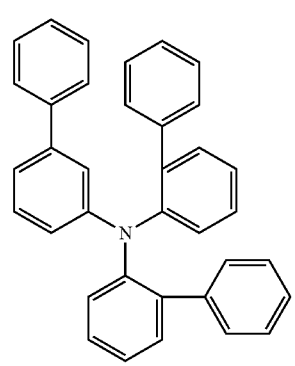
40
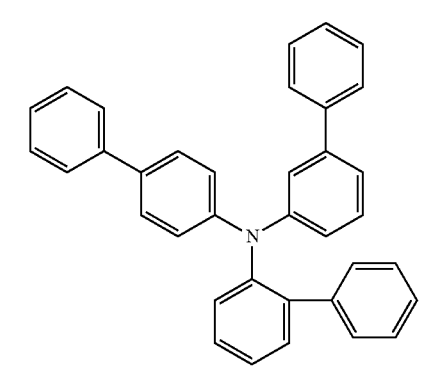
41
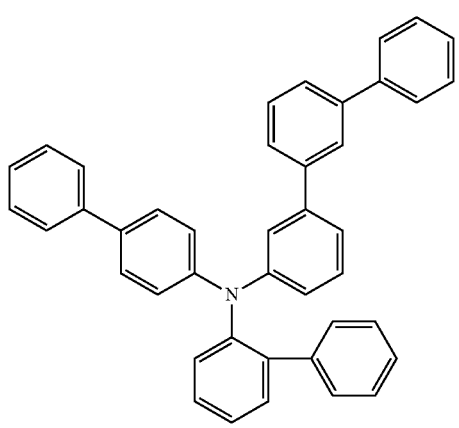
42
43
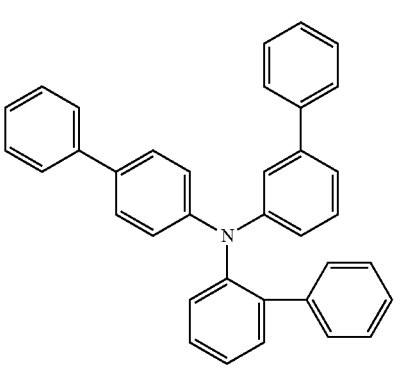

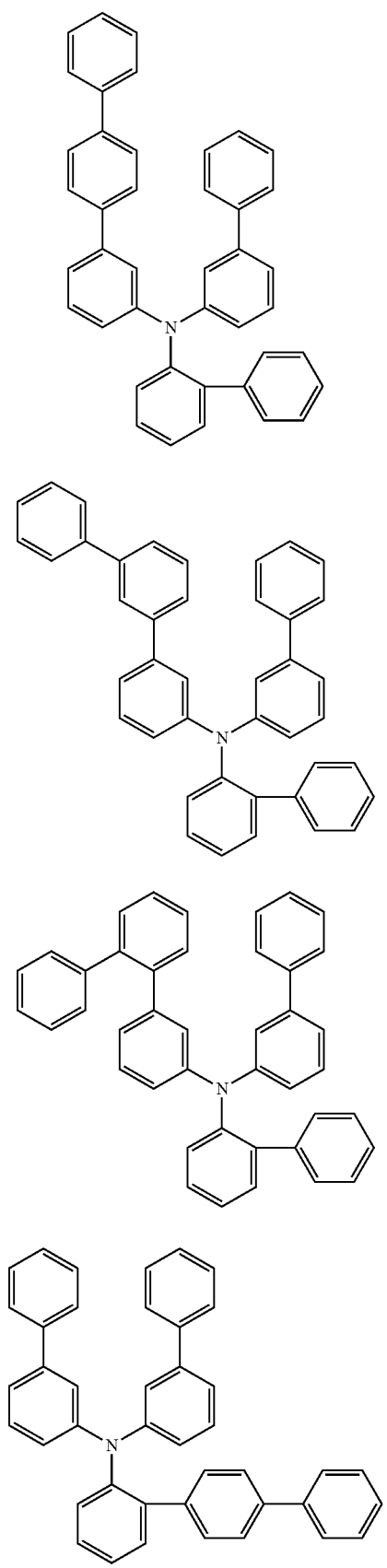
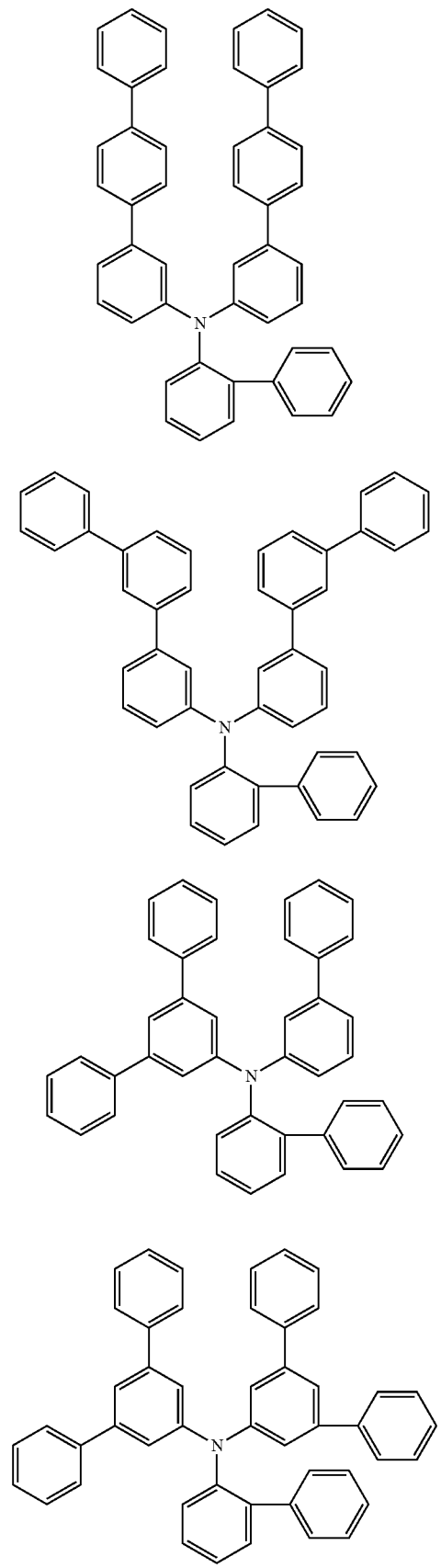

52
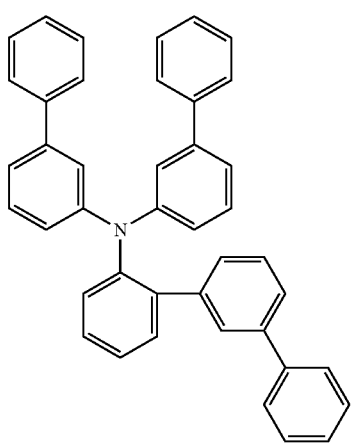
53
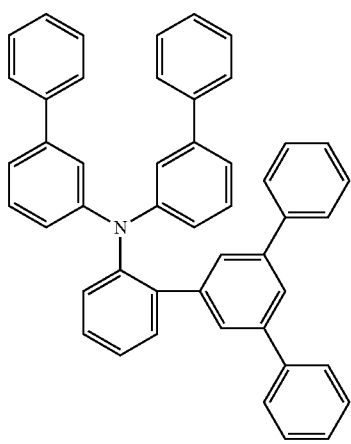
54
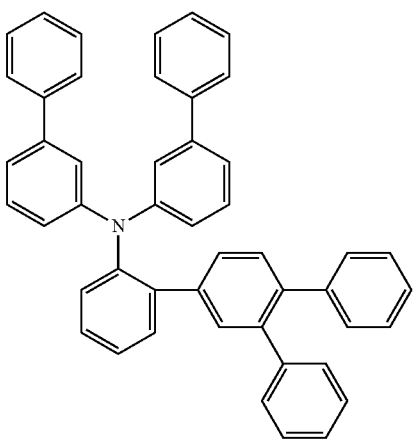
55
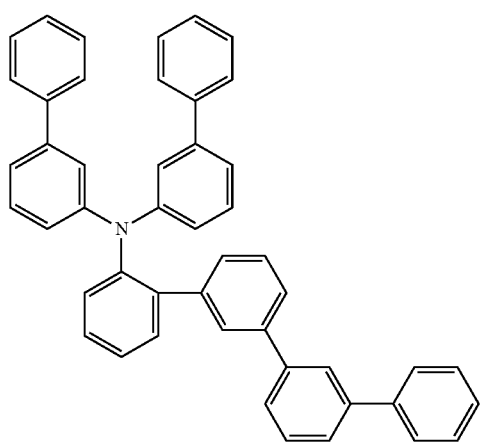
56
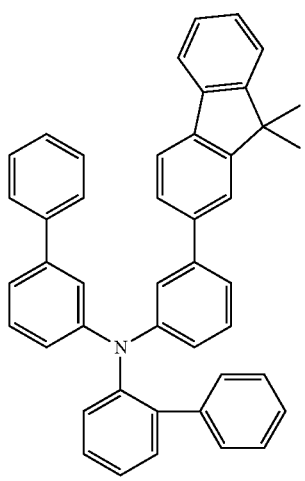
57
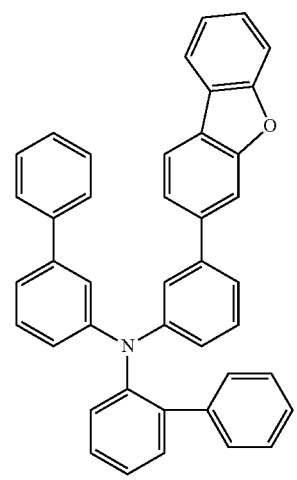

58
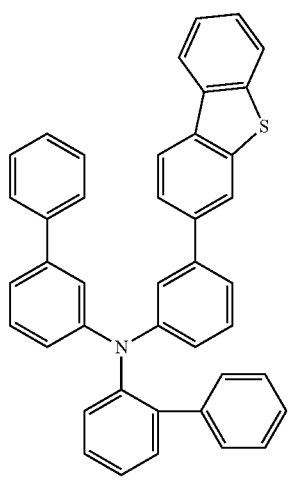
59
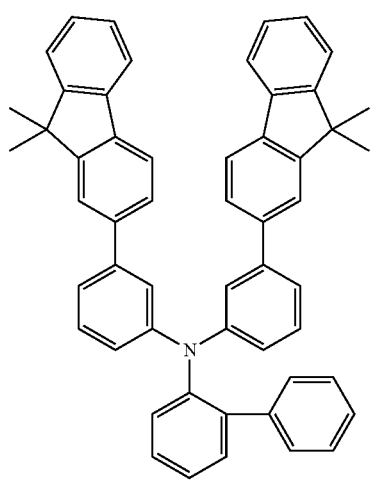
60
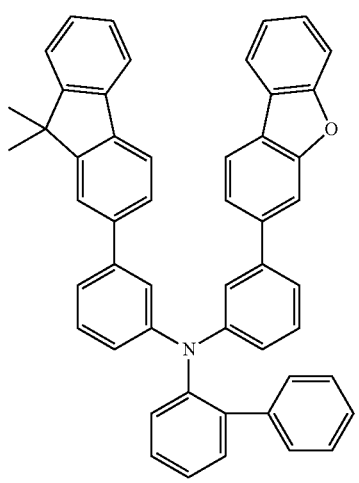
61
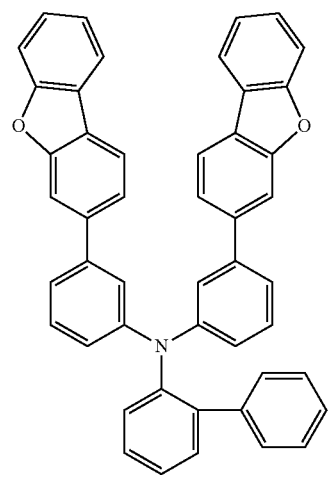
62
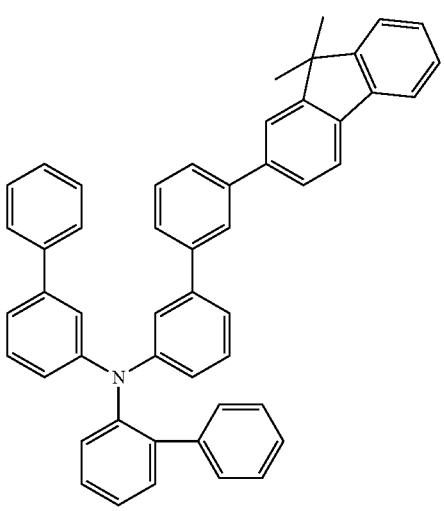
63
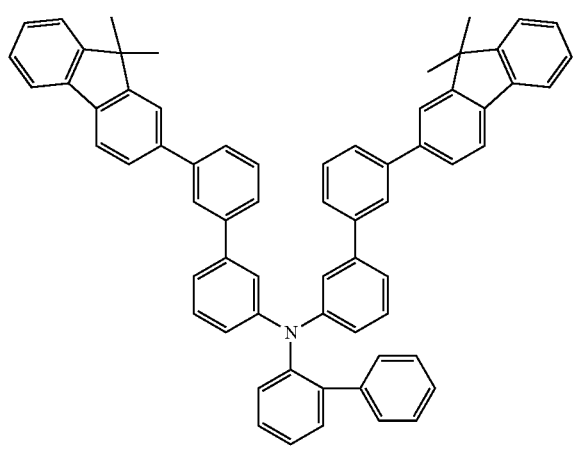

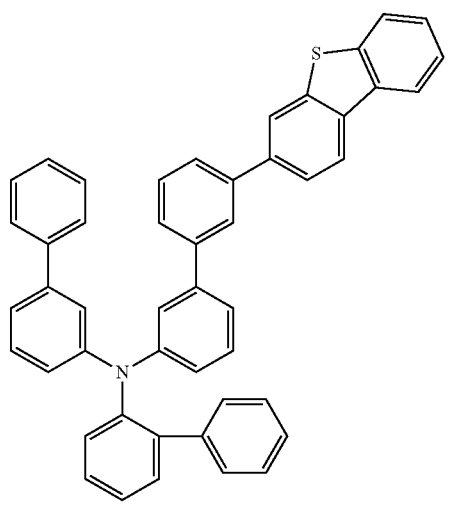
64
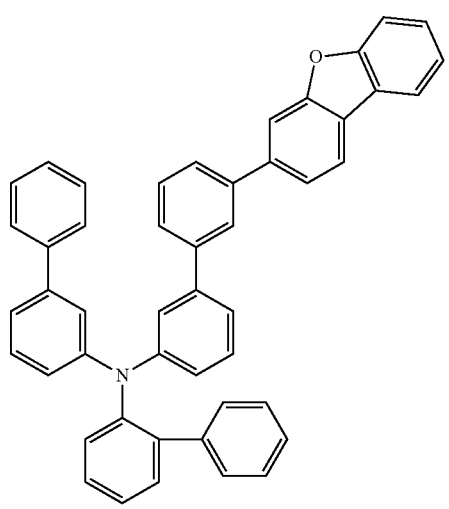
65
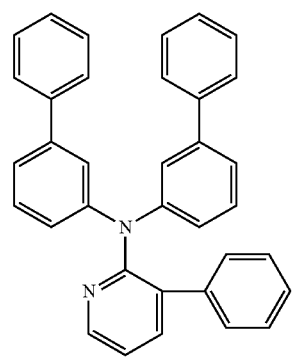
66
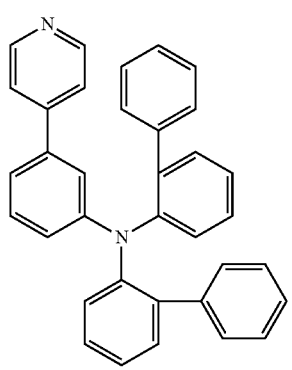
67
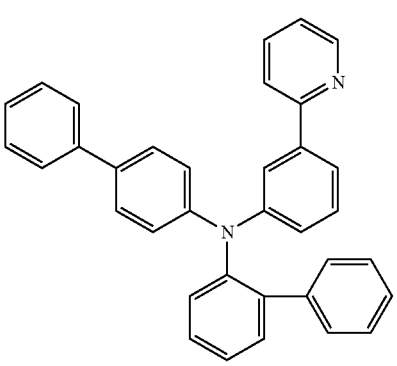
68
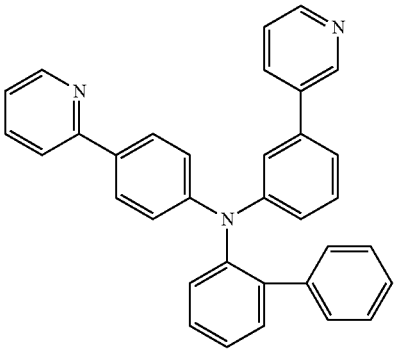
69
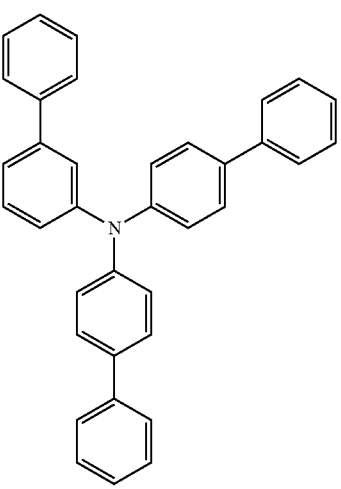
70

71
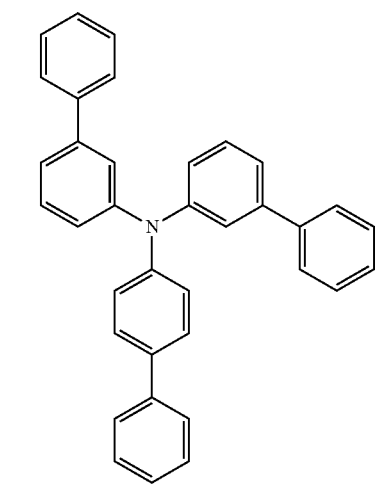
72
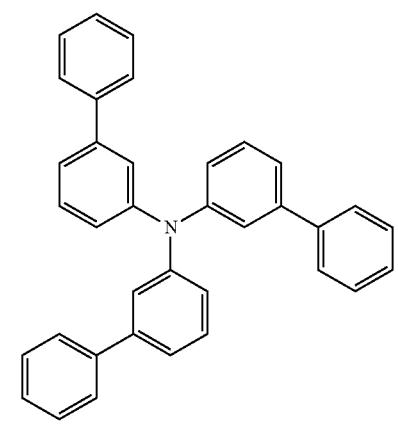
73
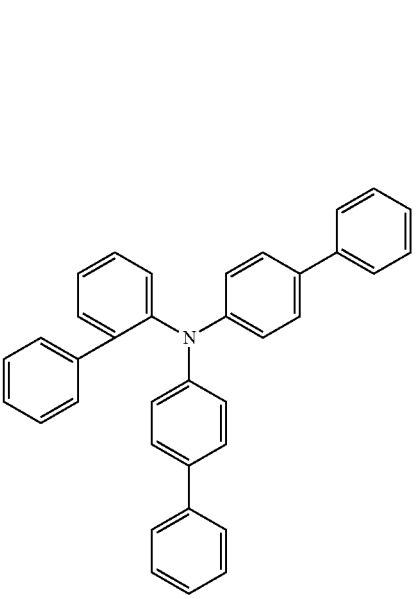
74
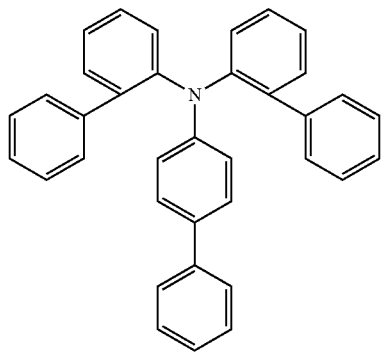
75
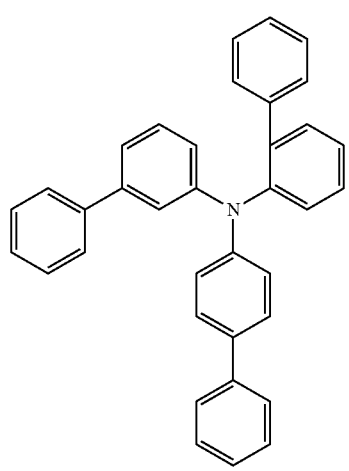
76
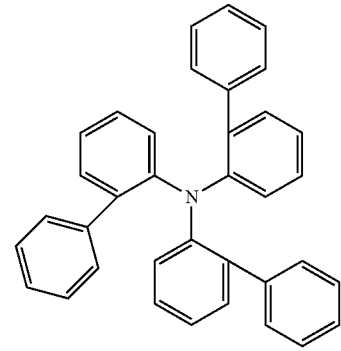
77
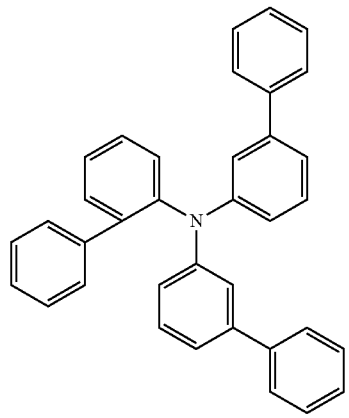

78
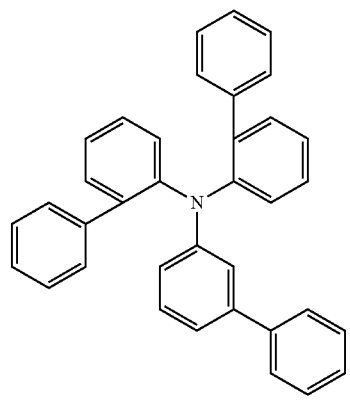
79
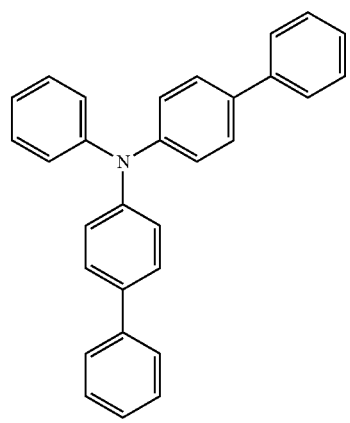
80
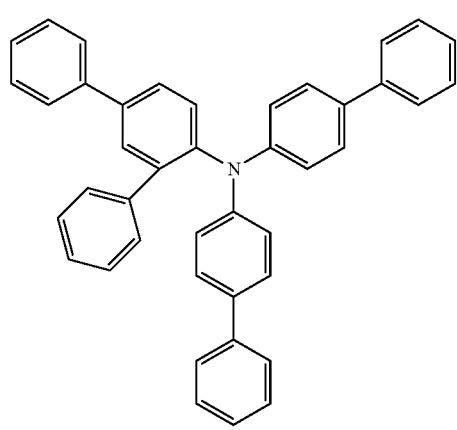
81
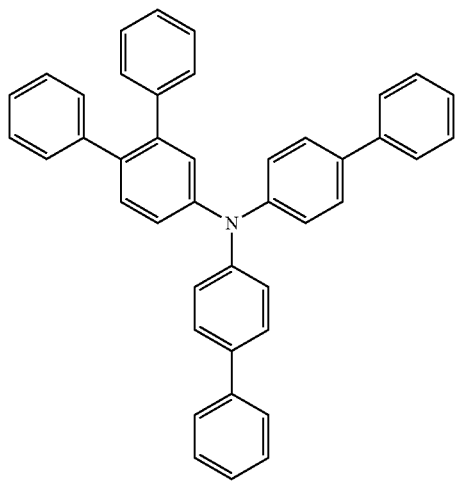
82
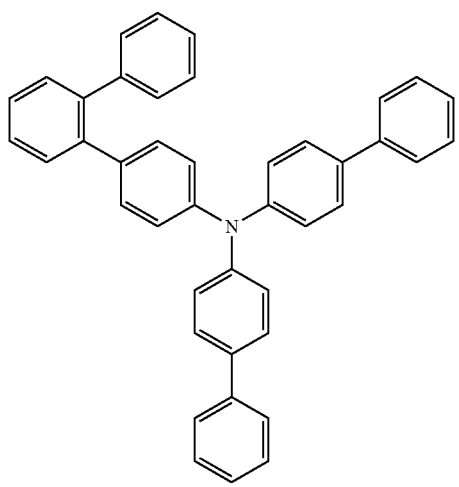
83
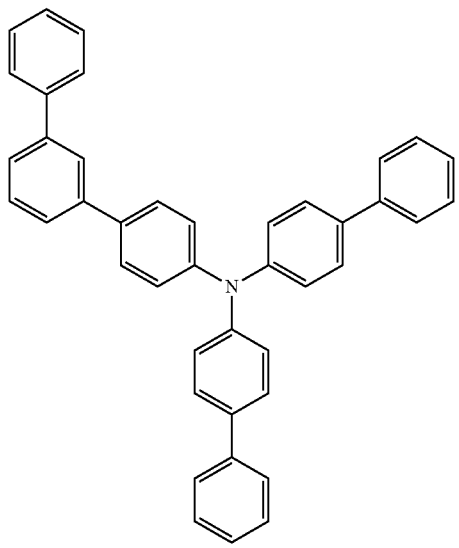

84
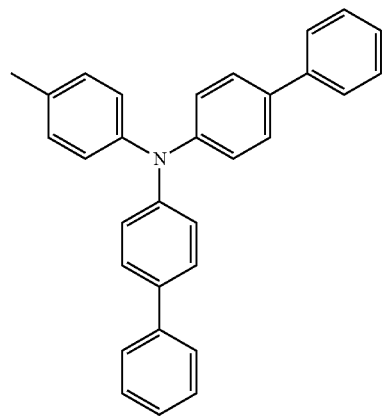
85
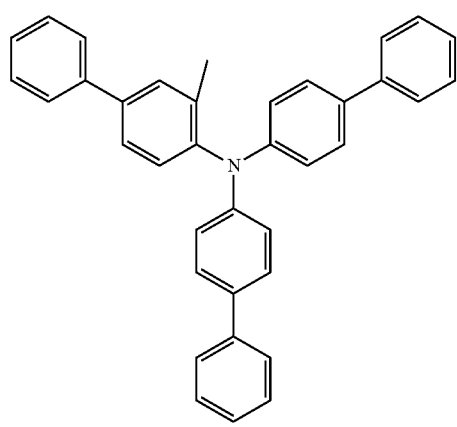
86
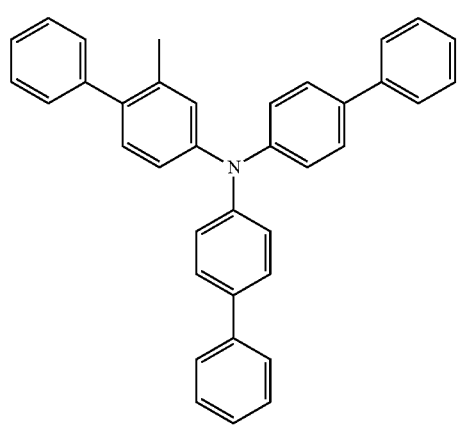
87
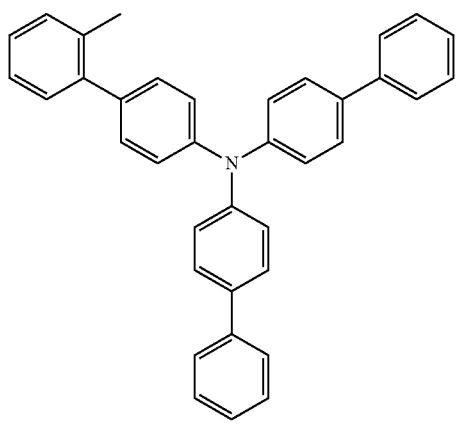
88
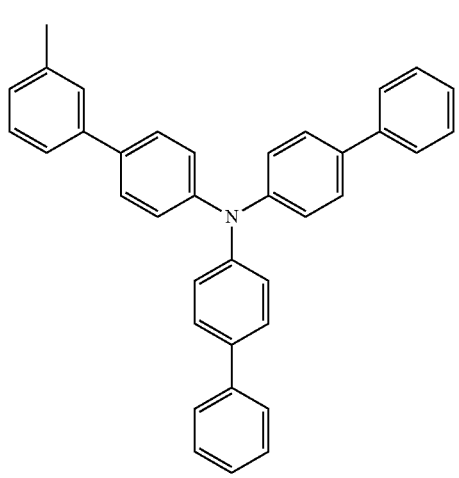
89
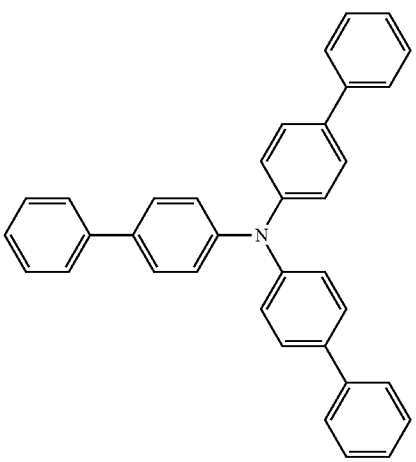

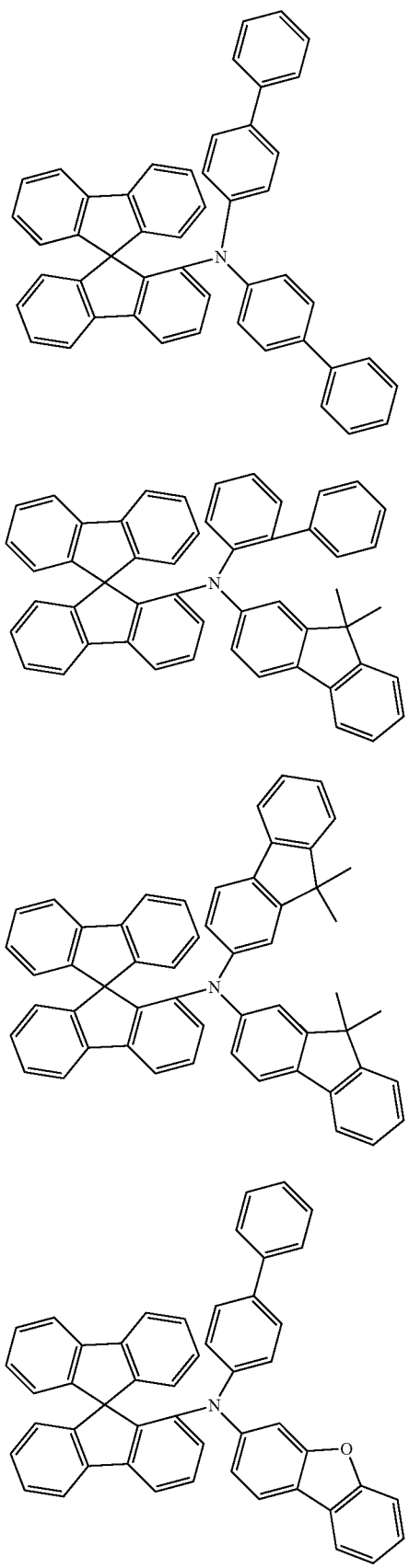
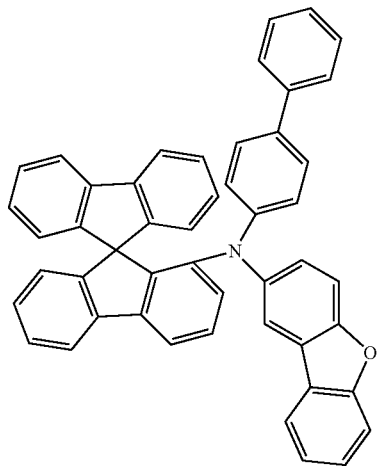
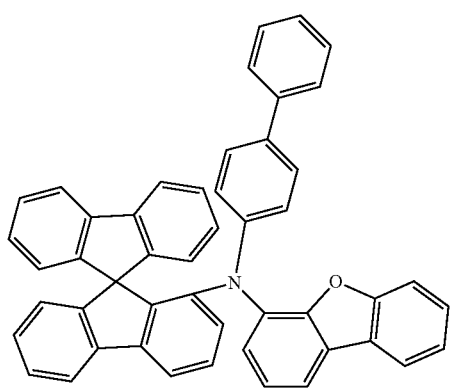
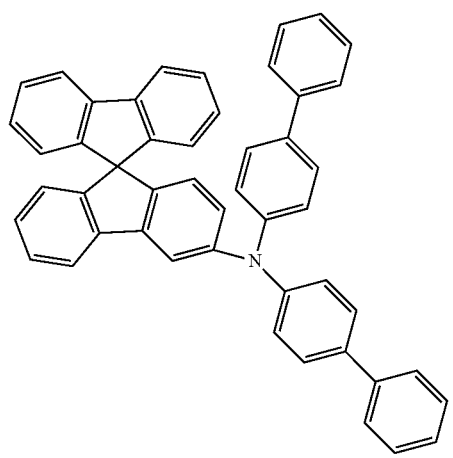

97
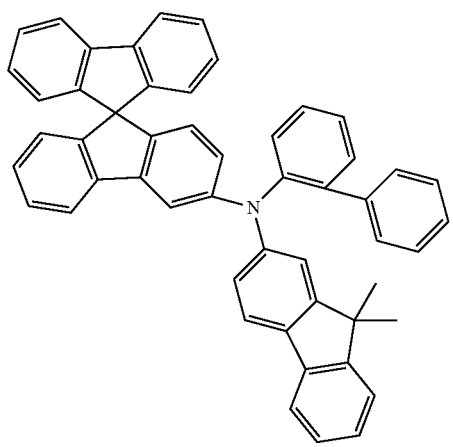
98
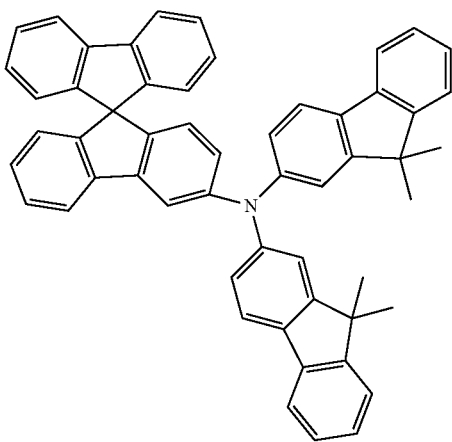
99
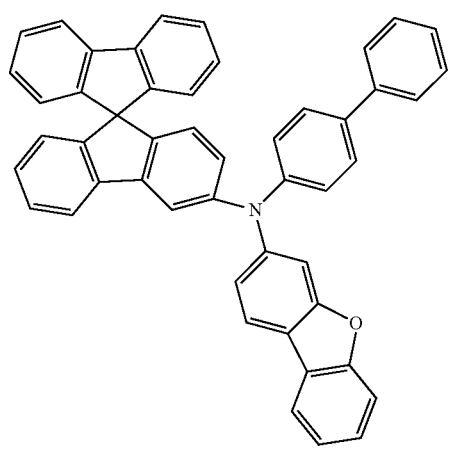
100
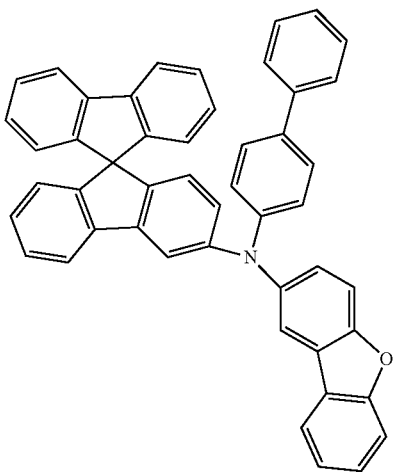
101
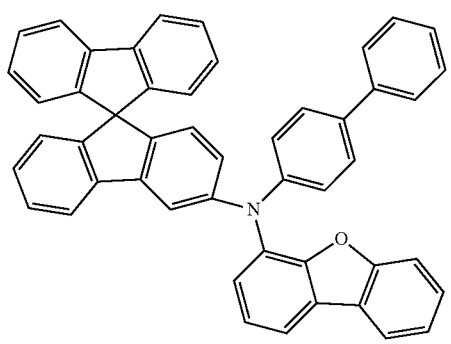
102
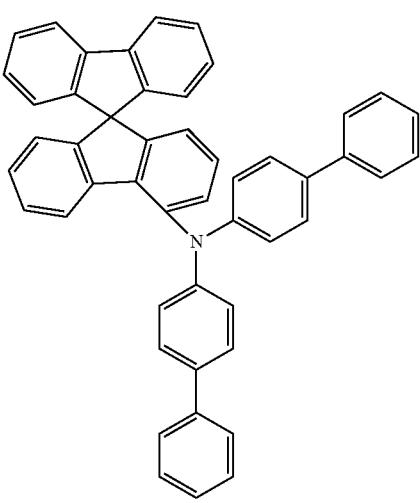

103
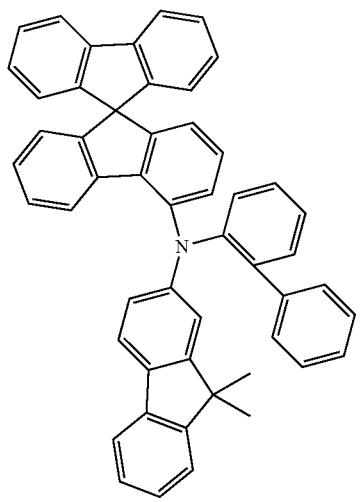
104
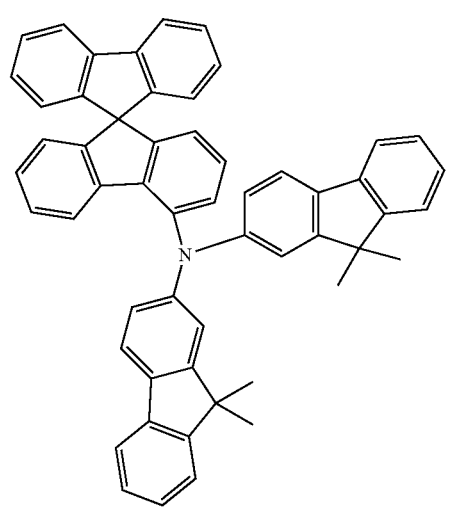
105
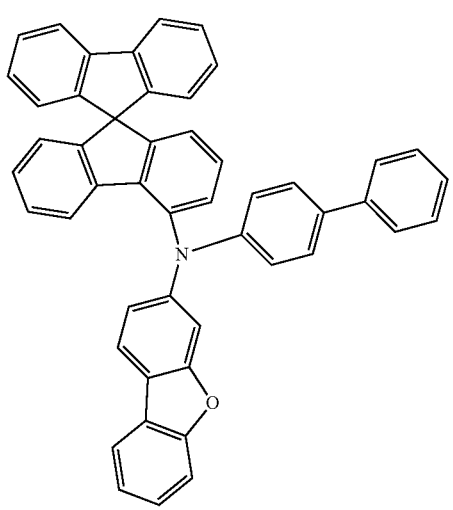
106
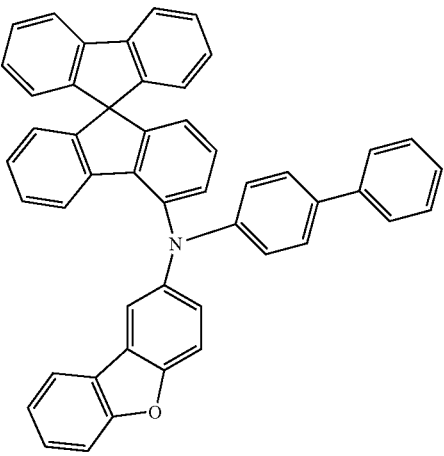
107
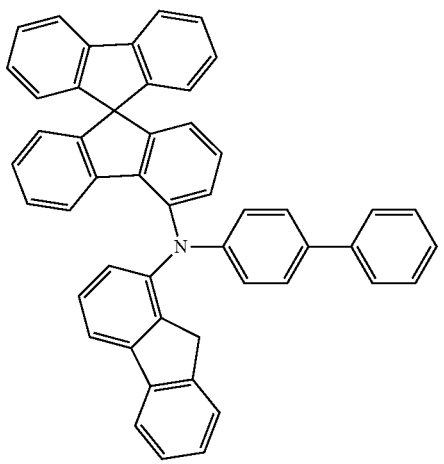
108
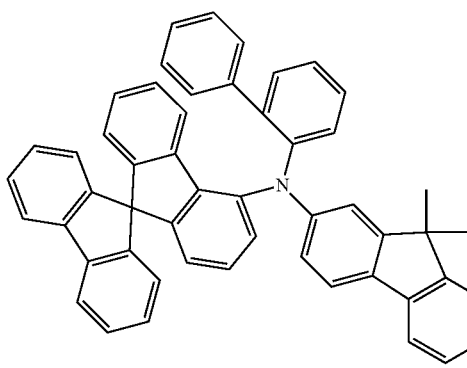

109
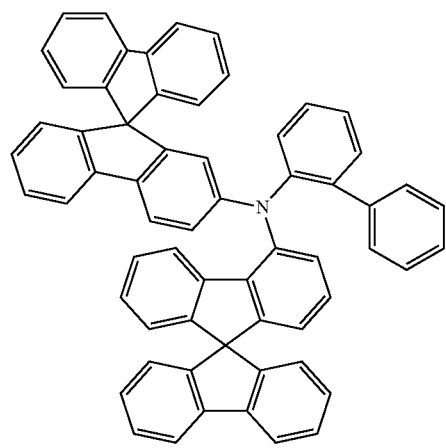
110
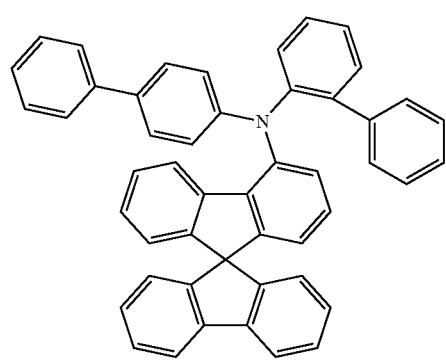
111
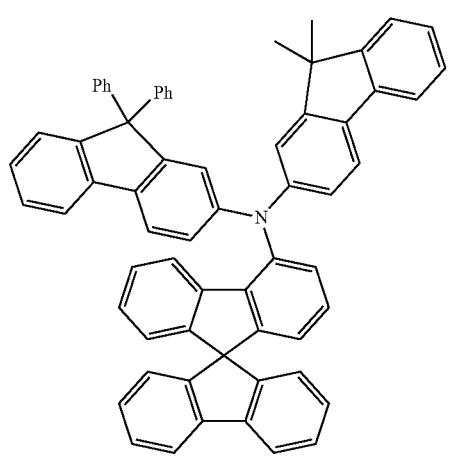
112
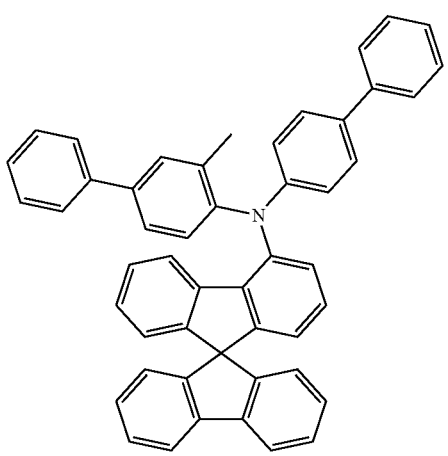
113
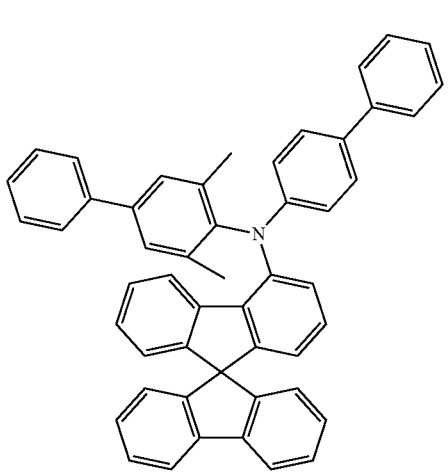
114
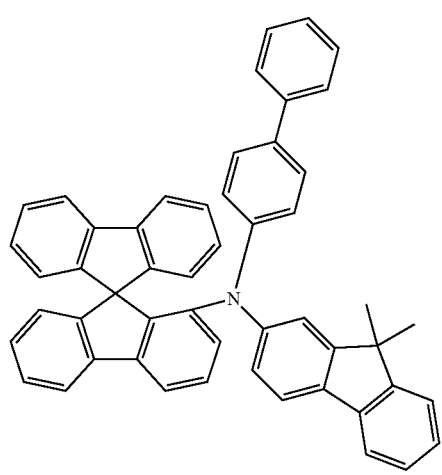

115 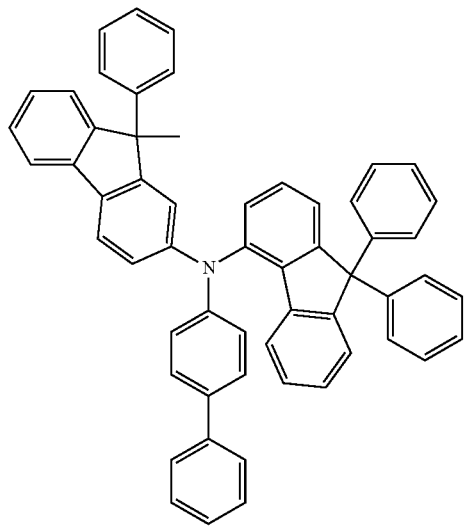
117 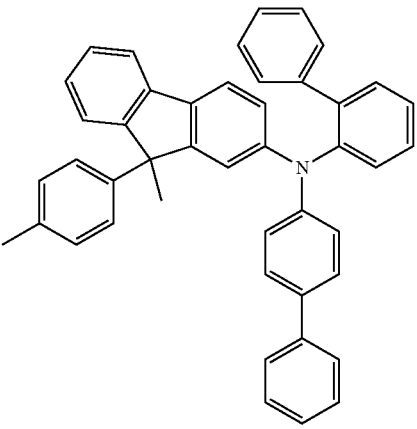
118 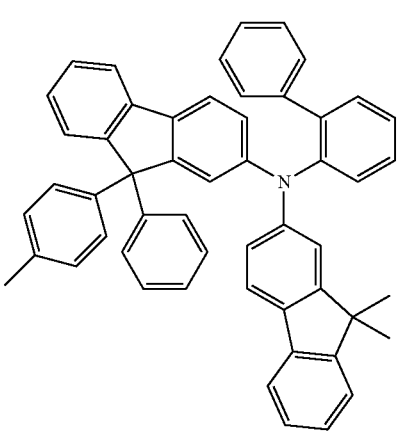
116
119 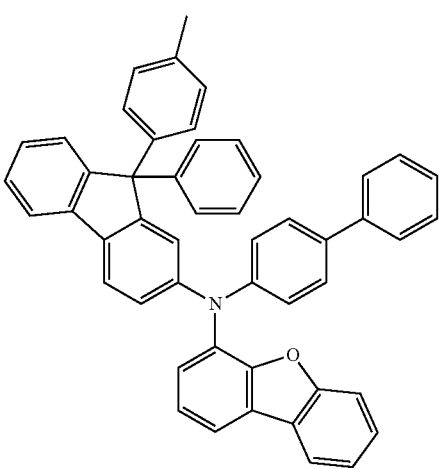

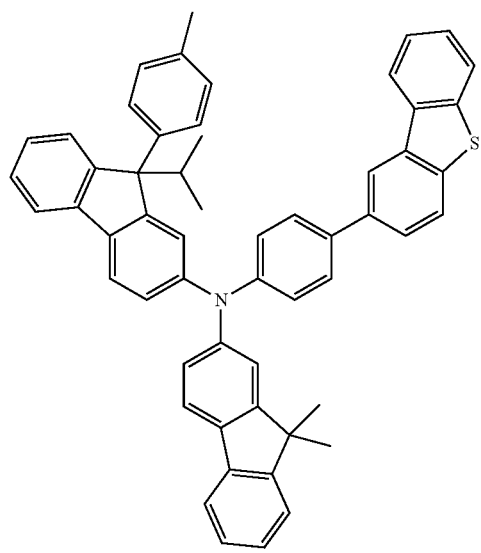
120
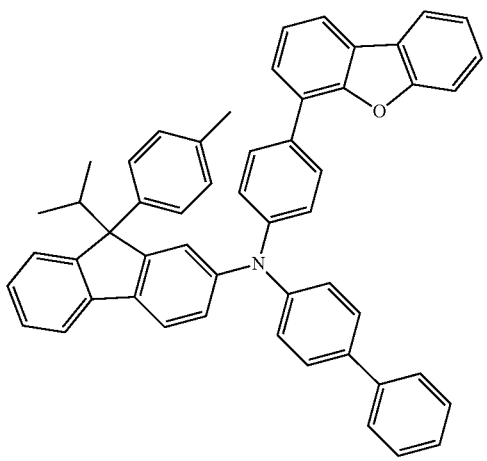
121
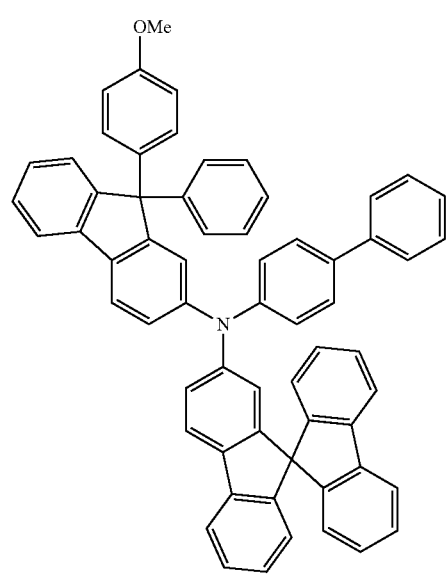
122
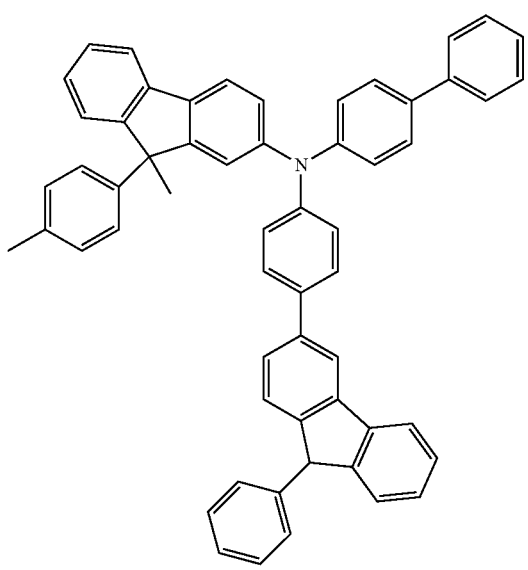
123
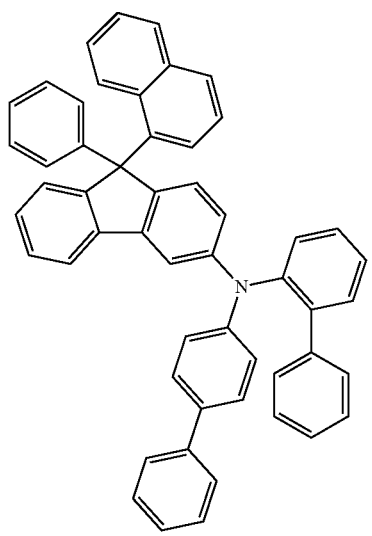
124
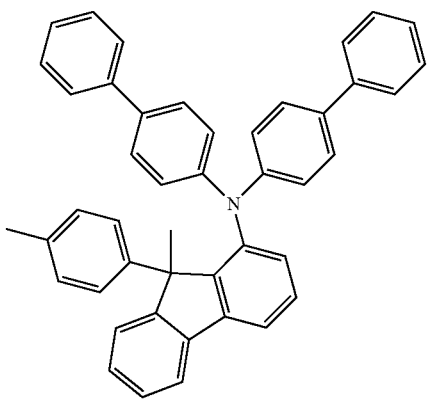
125

126 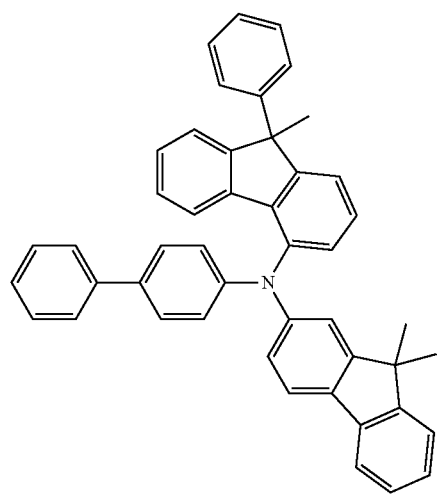
127 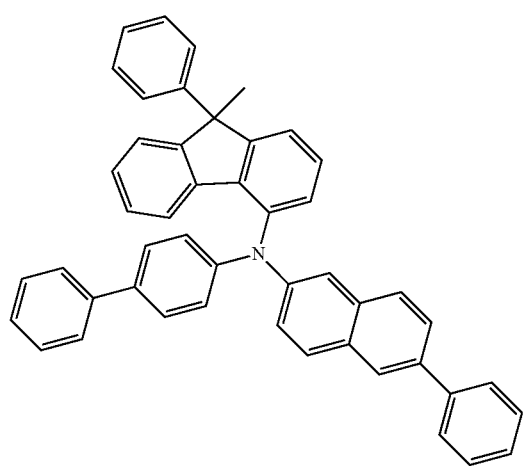
128 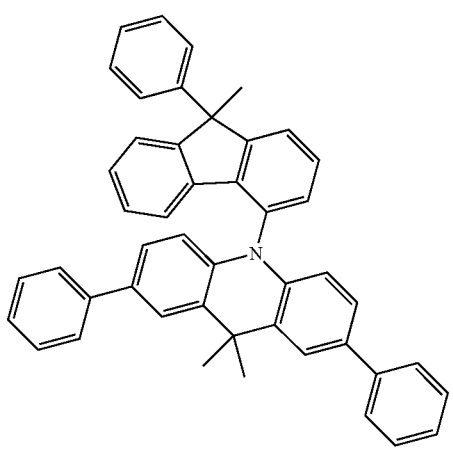
129 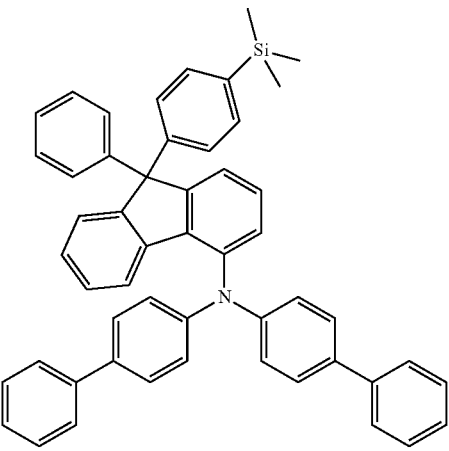
130 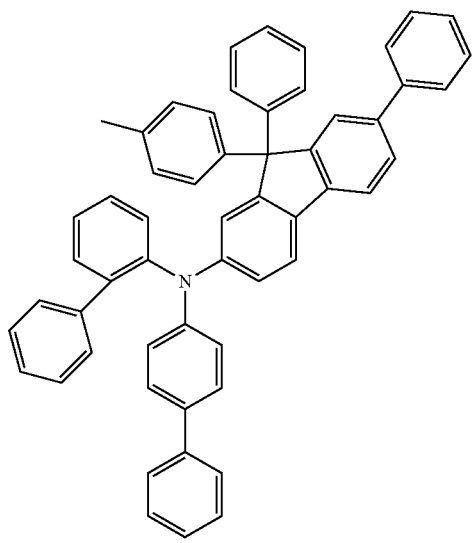
131 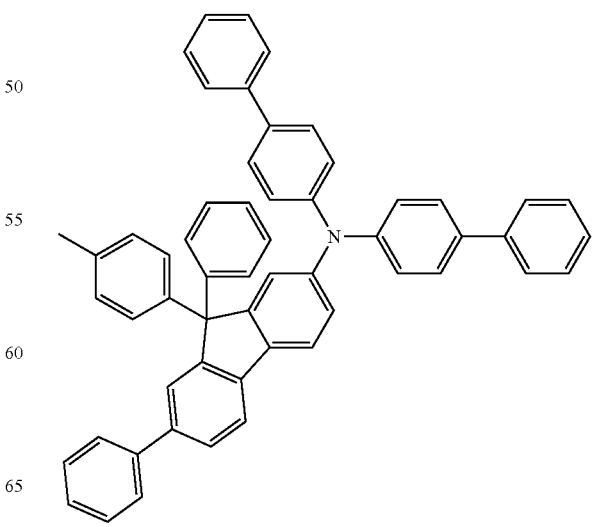

132
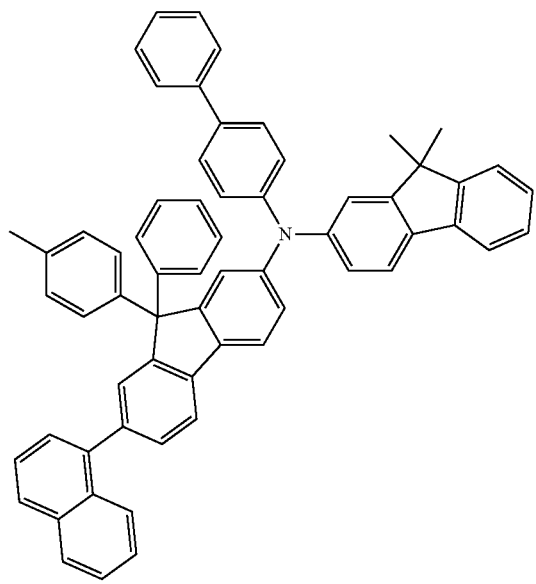
133
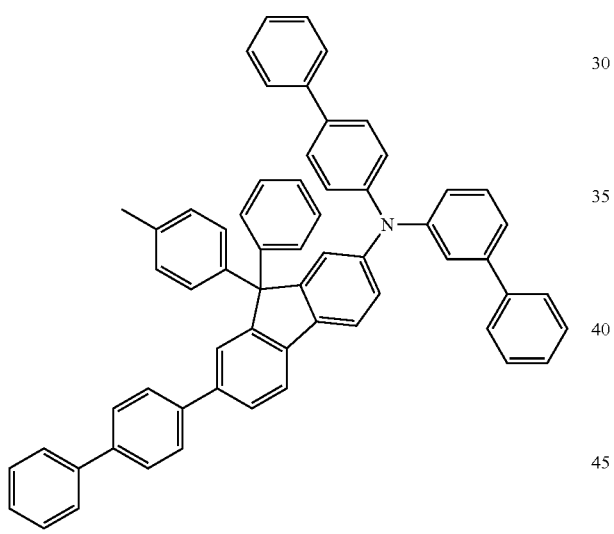
134
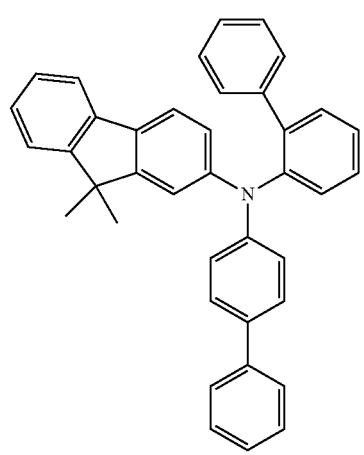
135
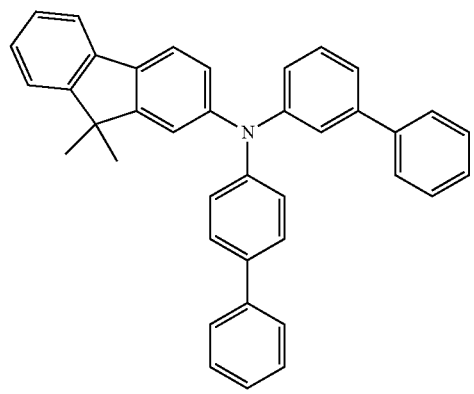
136
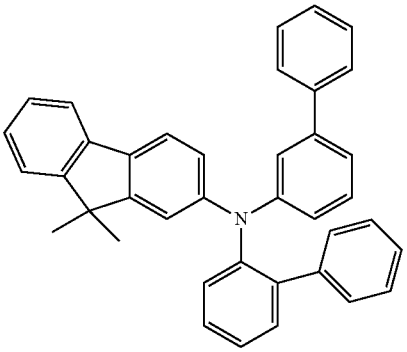
137
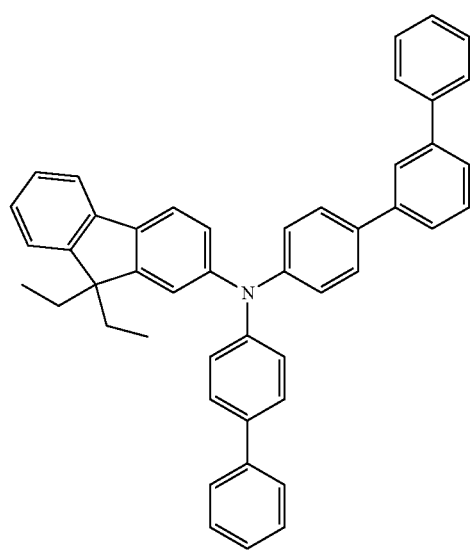

138
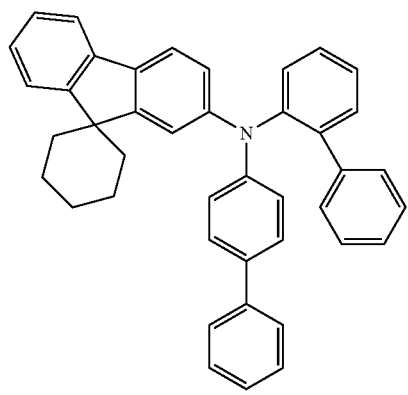
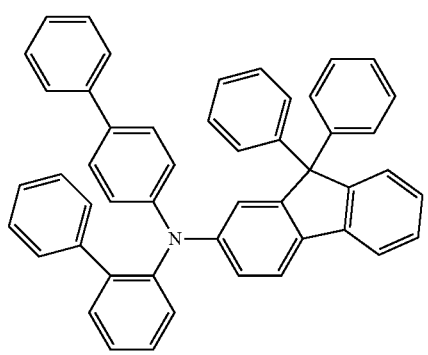
140
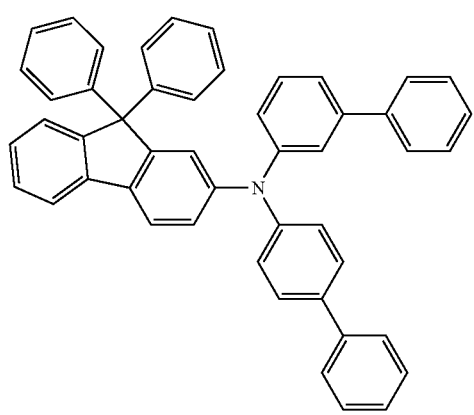
141
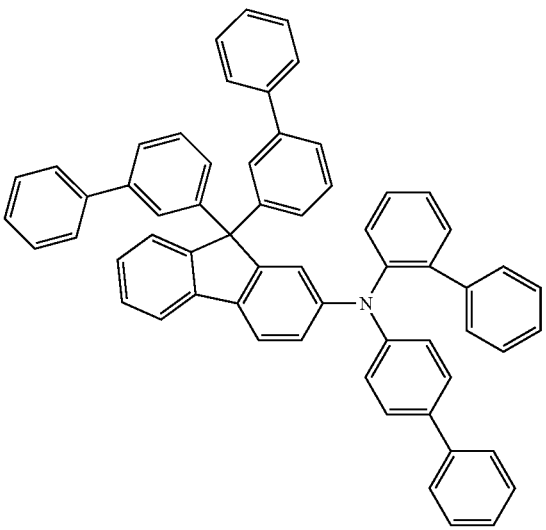
142
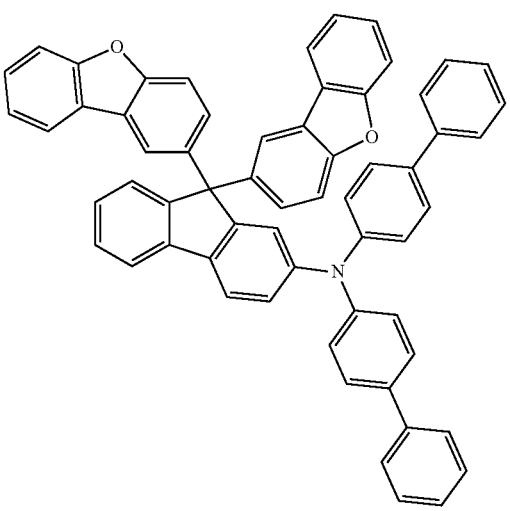

143
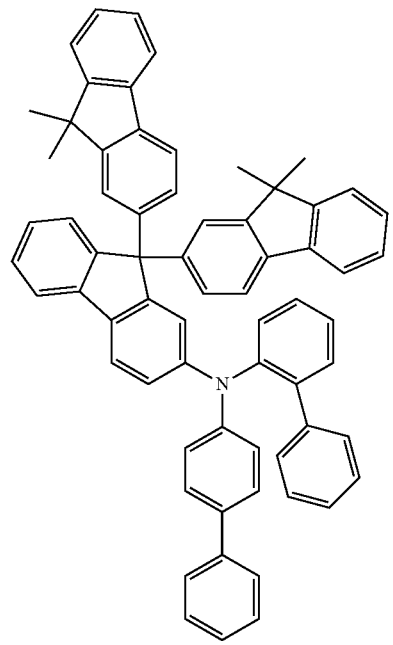
144
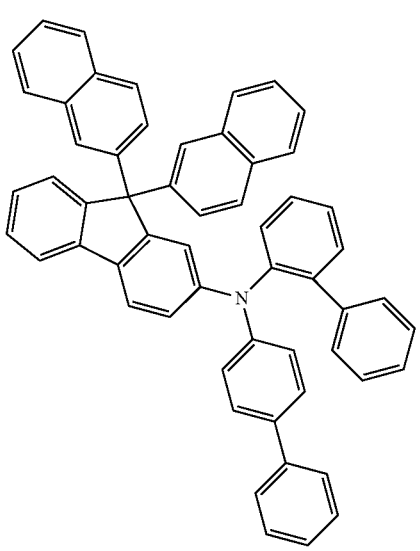
145
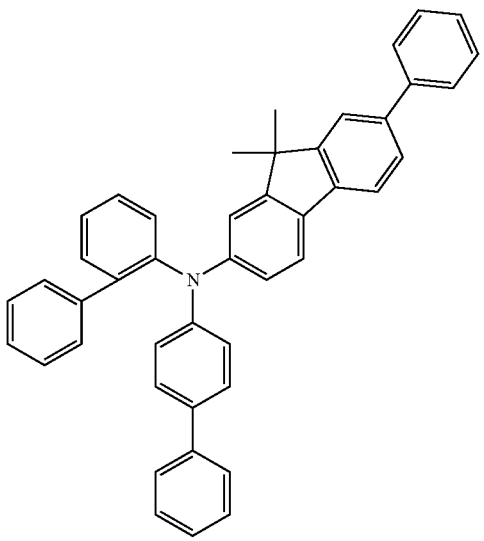
146
147

148
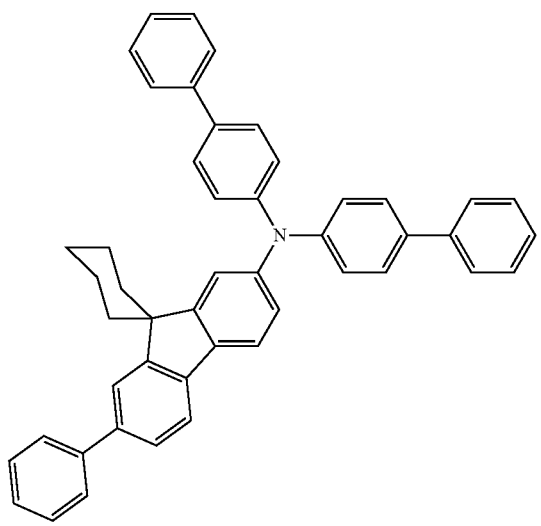
149
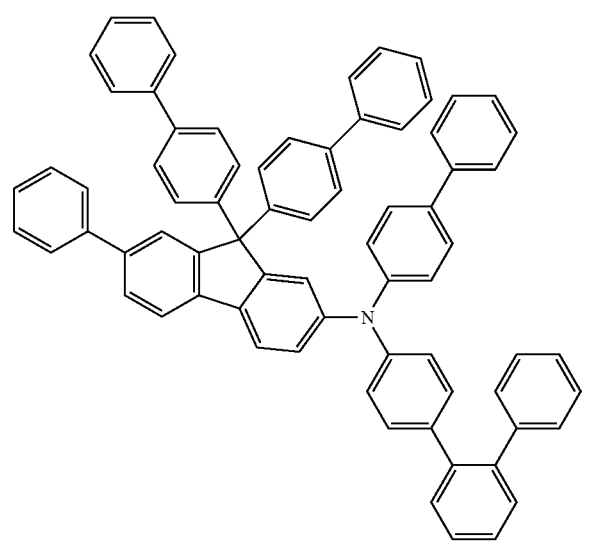
150
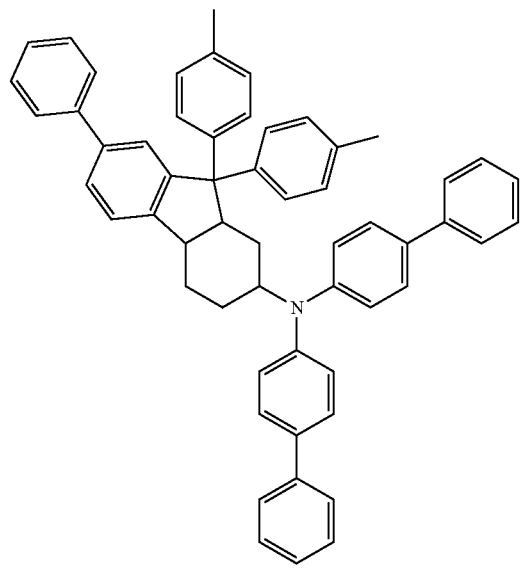
151
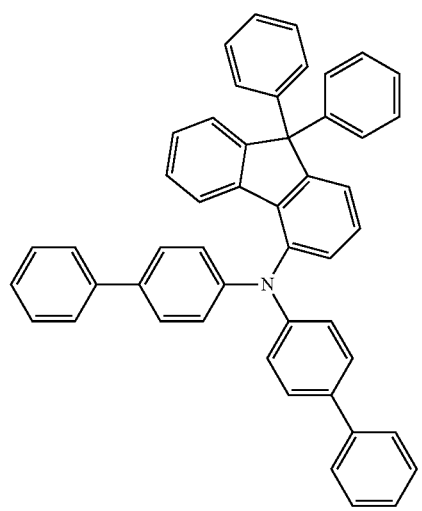
152
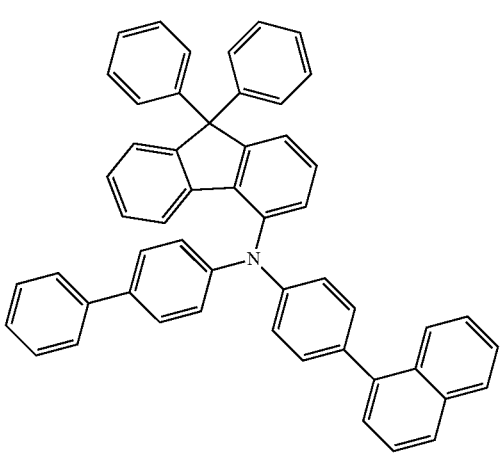

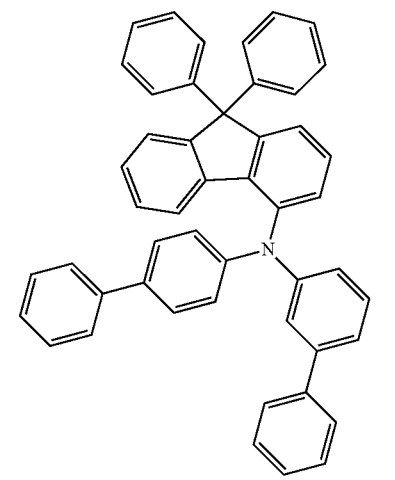
153
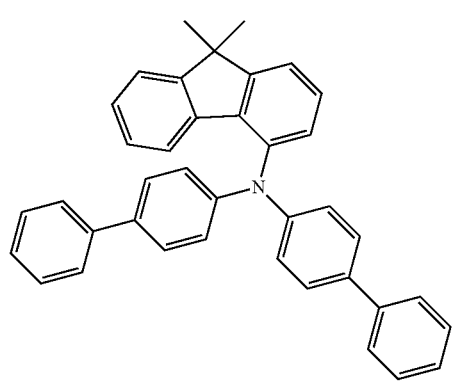
154
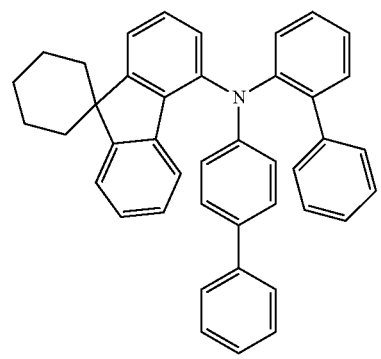
155
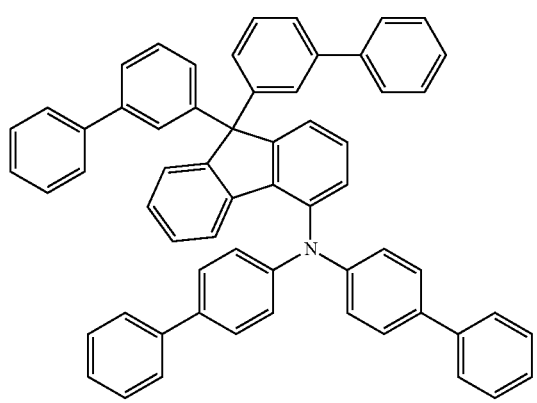
156
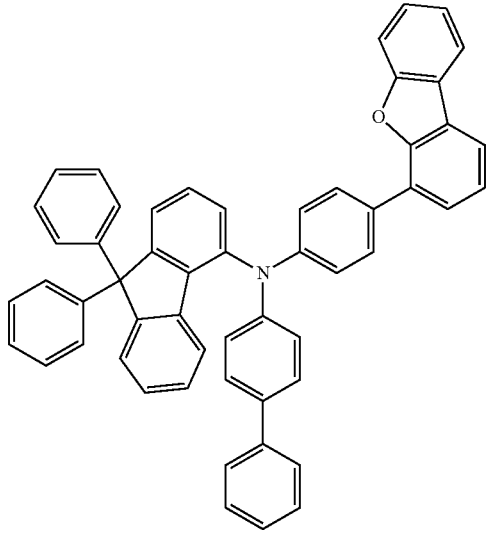
157
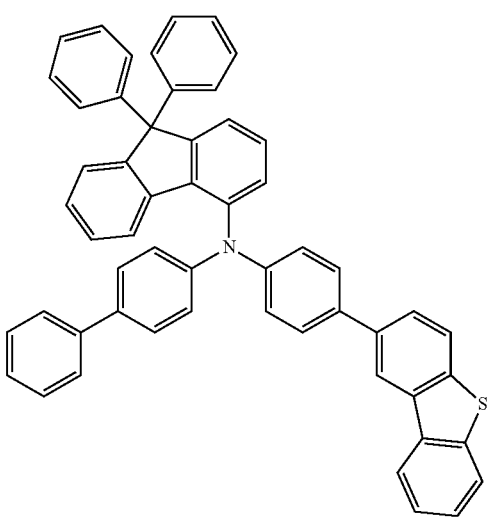
158
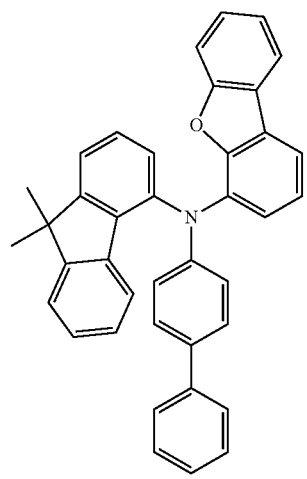
159

160
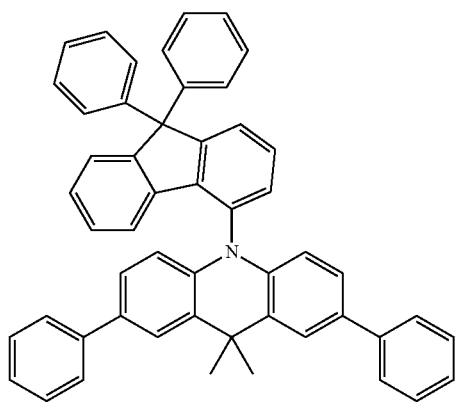
161
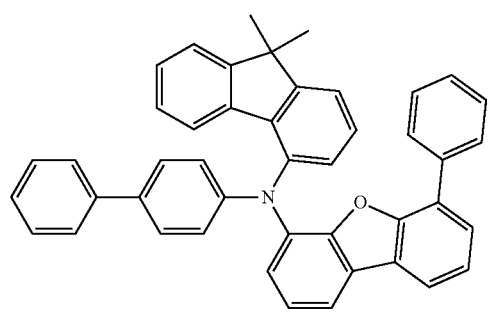
162
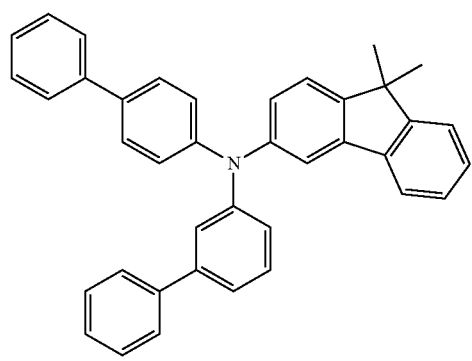
163
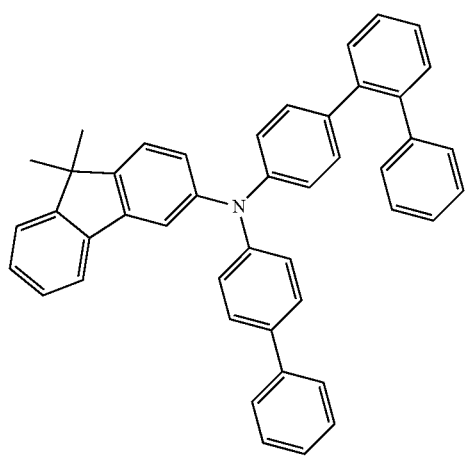
164
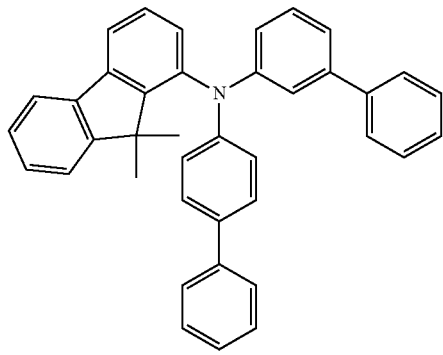
165
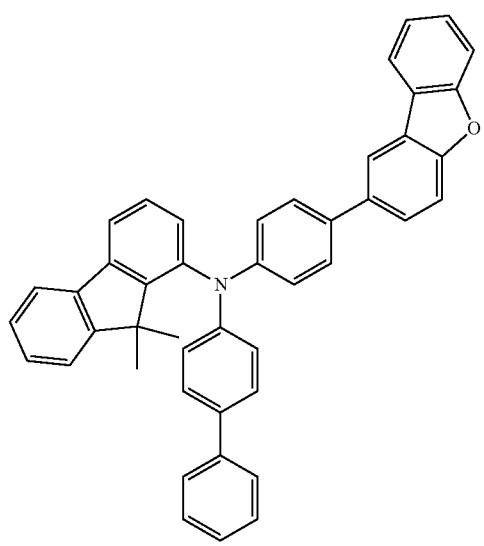
166
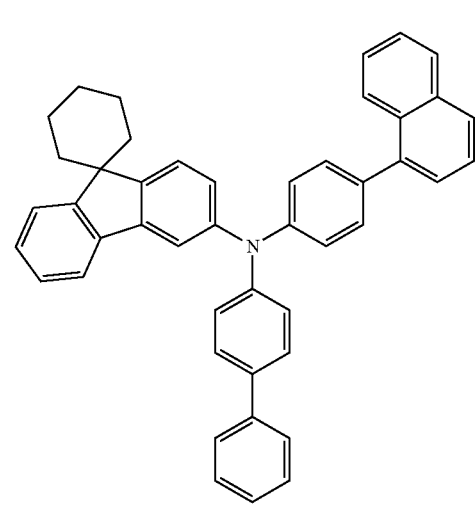

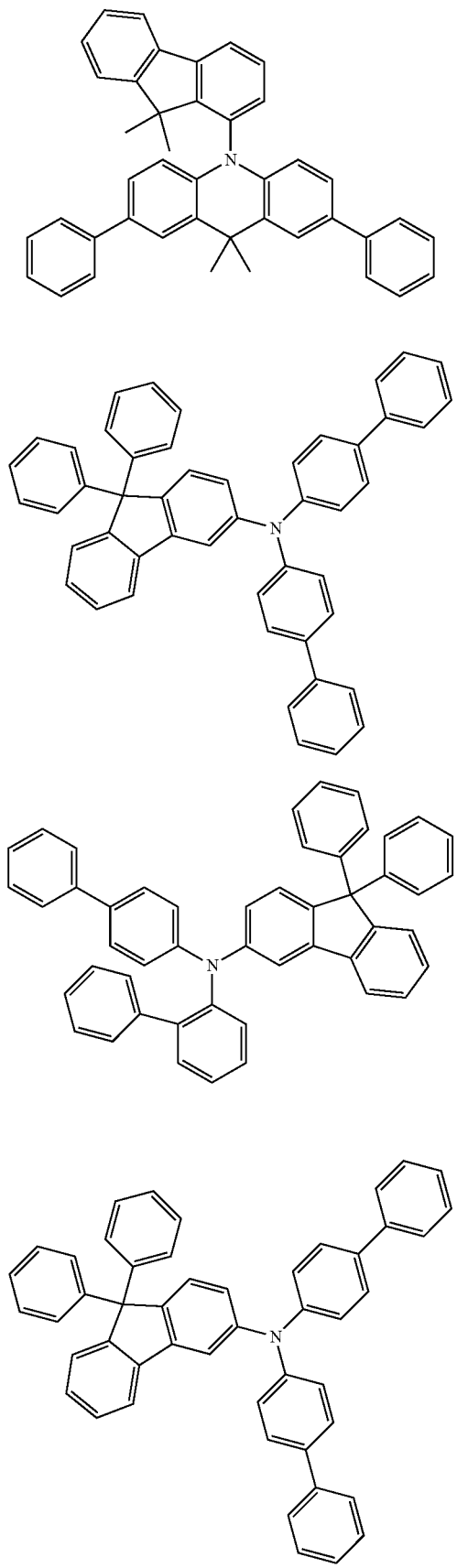
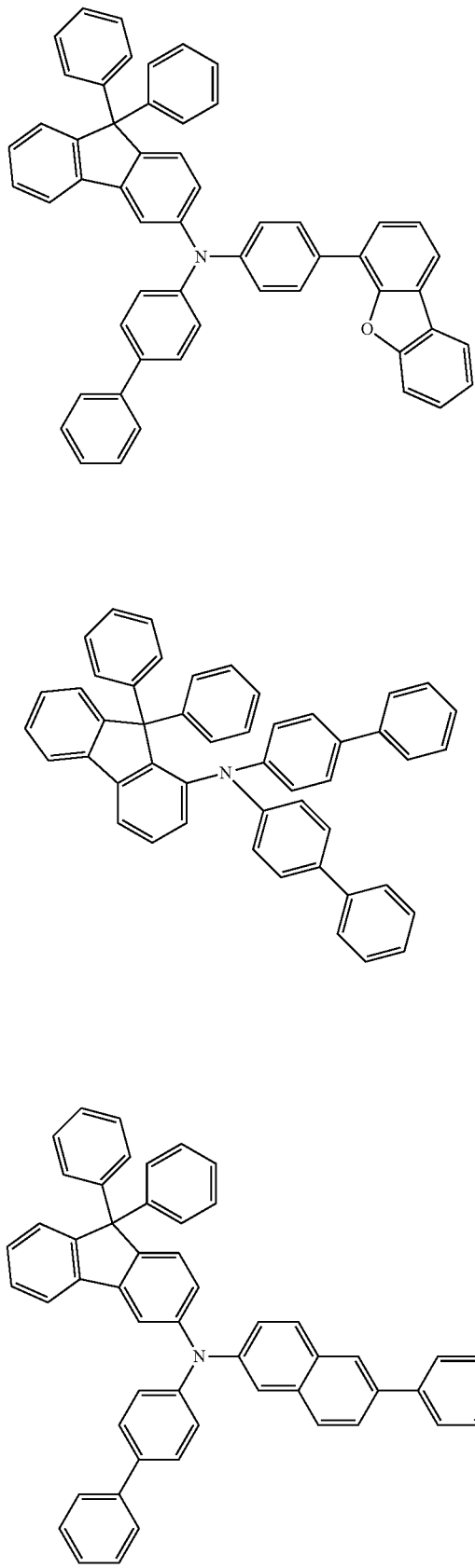

174
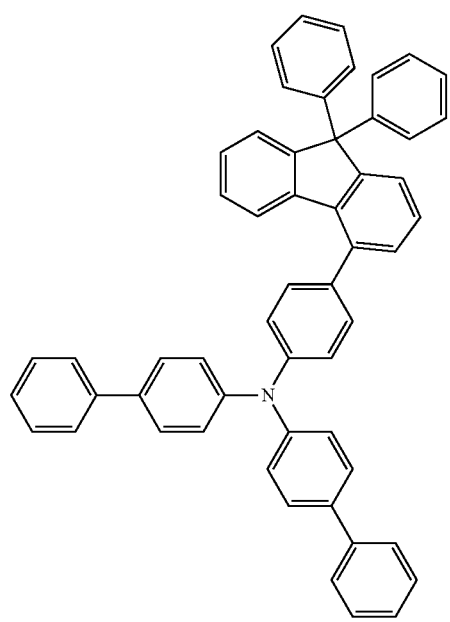
175
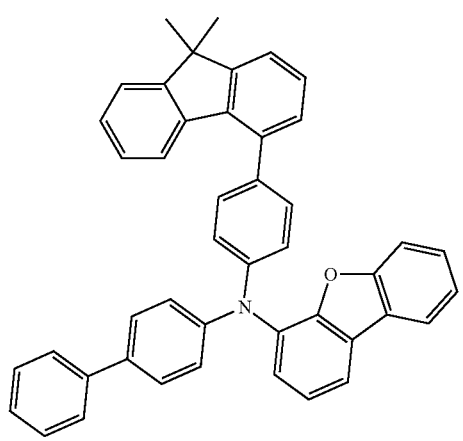
176
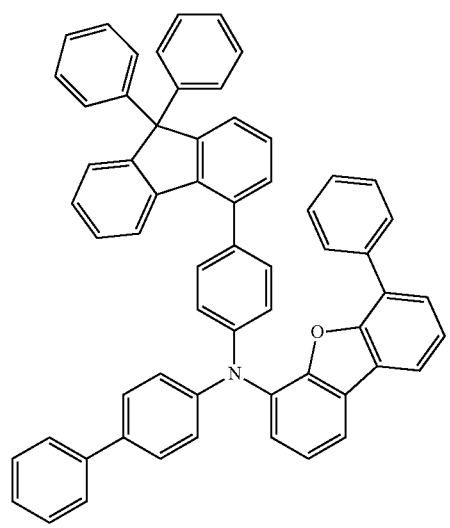
177
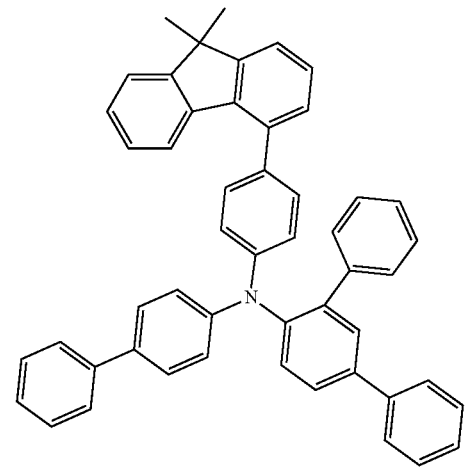
178
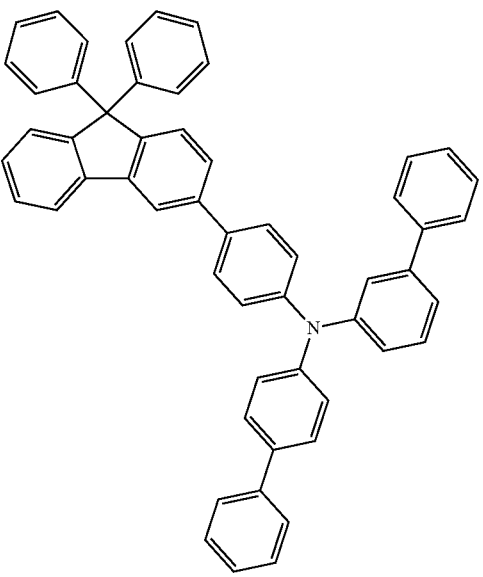
179
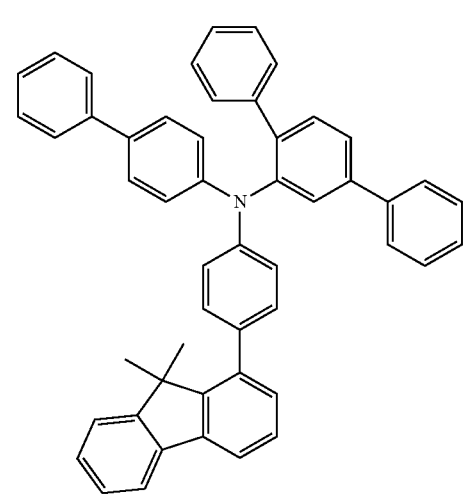

180
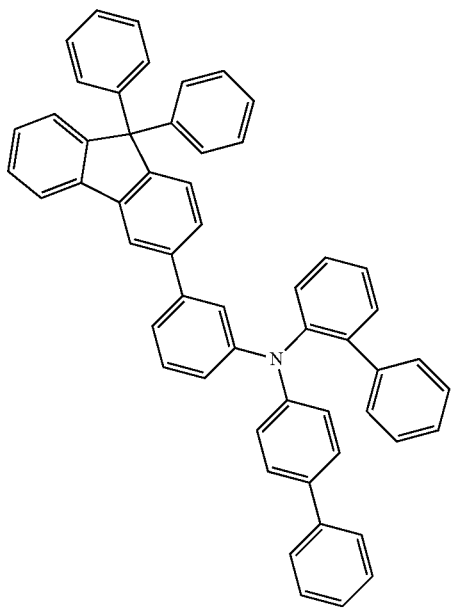
182
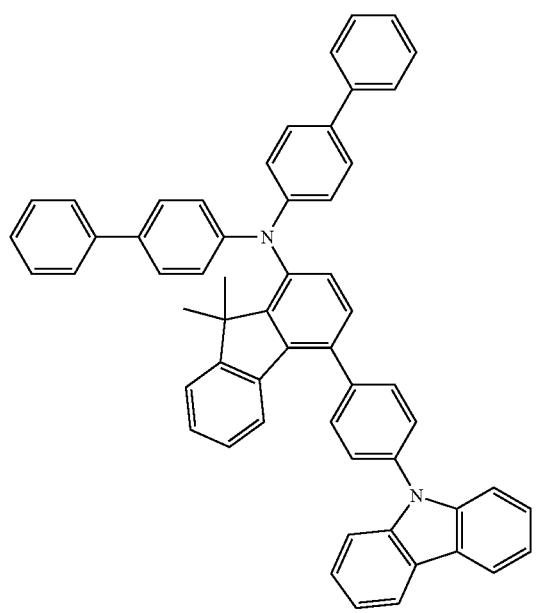
181
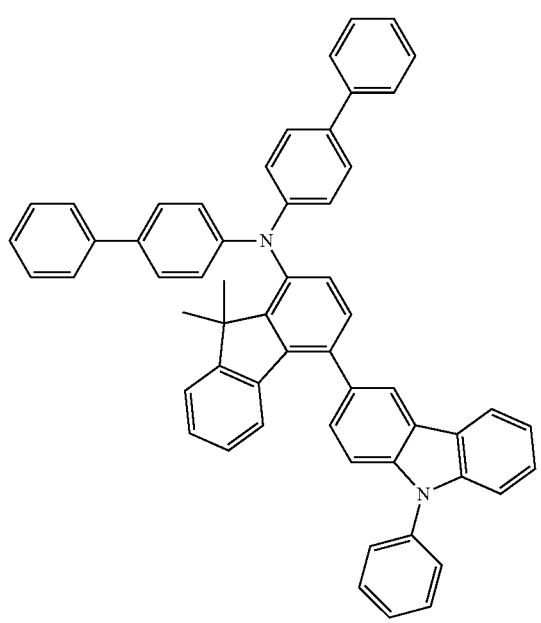
183
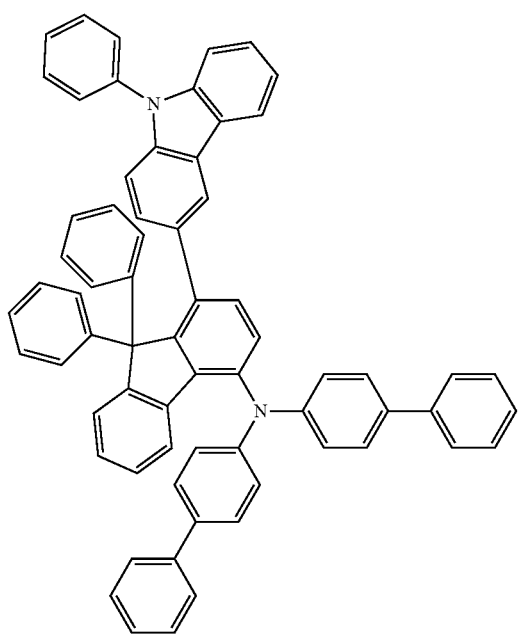

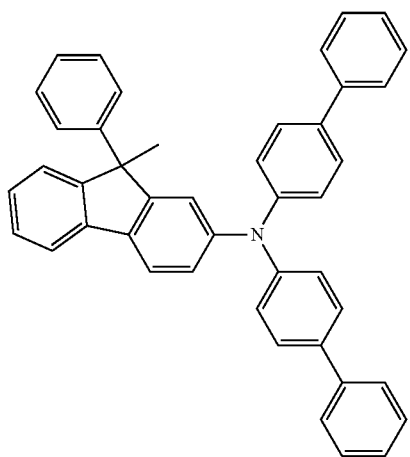

184

General definitions of chemical groups in the context of the present application follow:

An aryl group in the sense of this invention contains 6 to 60 aromatic ring atoms; a heteroaryl group in the sense of this invention contains 5 to 60 aromatic ring atoms, at least one of which is a heteroatom. The heteroatoms are preferably selected from N, O and S. This represents the basic definition. If other preferences are indicated in the description of the present invention, for example with respect to the number of aromatic ring atoms or the heteroatoms present, these apply.

An aryl group or heteroaryl group here is taken to mean either a simple aromatic ring, i.e. benzene, or a simple heteroaromatic ring, for example pyridine, pyrimidine or thiophene, or a condensed (annellated) aromatic or heteroaromatic polycycle, for example naphthalene, phenanthrene, quinoline or carbazole. A condensed (annellated) aromatic or heteroaromatic polycycle in the sense of the present application consists of two or more simple aromatic or heteroaromatic rings condensed with one another.

An aryl or heteroaryl group, which may in each case be substituted by the above-mentioned radicals and which may be linked to the aromatic or heteroaromatic ring system via any desired positions, is taken to mean, in particular, groups derived from benzene, naphthalene, anthracene, phenanthrene, pyrene, dihydropyrene, chrysene, perylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

An aryloxy group in accordance with the definition of the present invention is taken to mean an aryl group, as defined above, which is bonded via an oxygen atom. An analogous definition applies to heteroaryloxy groups.

An aromatic ring system in the sense of this invention contains 6 to 60 C atoms in the ring system. A heteroaromatic ring system in the sense of this invention contains 5 to 60 aromatic ring atoms, at least one of which is a heteroatom. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be connected by a non-aromatic unit (preferably less than 10% of the atoms other than H), such as, for example, an $sp^3$-hybridised C, Si, N or O atom, an $sp^2$-hybridised C or N atom or an sp-hybridised C atom. Thus, for example, systems such as 9,9'-spirobifluorene, 9,9'-diarytfluorene, triarylamine, diaryl ether, stilbene, etc., are also intended to be taken to be aromatic ring systems in the sense of this invention, as are systems in which two or more aryl groups are connected, for example, by a linear or cyclic alkyl, alkenyl or alkynyl group or by a silyl group. Furthermore, systems in which two or more aryl or heteroaryl groups are linked to one another via single bonds are also taken to be aromatic or heteroaromatic ring systems in the sense of this invention, such as, for example, systems such as biphenyl, terphenyl or diphenyltriazine.

An aromatic or heteroaromatic ring system having 5-60 aromatic ring atoms, which may in each case also be substituted by radicals as defined above and which may be linked to the aromatic or heteroaromatic group via any desired positions, is taken to mean, in particular, groups derived from benzene, naphthalene, anthracene, benzanthracene, phenanthrene, benzophenanthrene, pyrene, chrysene, perylene, fluoranthene, naphthacene, pentacene, benzopyrene, biphenyl, biphenylene, terphenyl, terphenylene, quaterphenyl, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4, 5-tetrazine, 1,2,3,4-tetrazine, 1,2,3,5-tetrazine, purine, pteridine, indolizine and benzothiadiazole or combinations of these groups.

For the purposes of the present invention, a straight-chain alkyl group having 1 to 40 C atoms or a branched or cyclic alkyl group having 3 to 40 C atoms or an alkenyl or alkynyl group having 2 to 40 C atoms, in which, in addition, individual H atoms or $CH_2$ groups may be substituted by the groups mentioned above under the definition of the radicals, is preferably taken to mean the radicals methyl, ethyl, n-propyl, i-propyl, n-butyl, i-butyl, s-butyl, t-butyl, 2-methylbutyl, n-pentyl, s-pentyl, cyclopentyl, neopentyl, n-hexyl, cyclohexyl, neohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl. An alkoxy or thioalkyl group having 1 to 40 C atoms is preferably taken to mean methoxy, trifluoromethoxy, ethoxy, n-propoxy, -propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy, 2,2,2-trifluoroethoxy, methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethyithio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynytthio, propynylthio, butynylthio, pentynylthio, hexynylthio, heptynylthio or octynylthio.

The formulation that two or more radicals may form a ring with one another is, for the purposes of the present application, intended to be taken to mean, inter alia, that the two radicals are linked to one another by a chemical bond. This is illustrated by the following scheme:

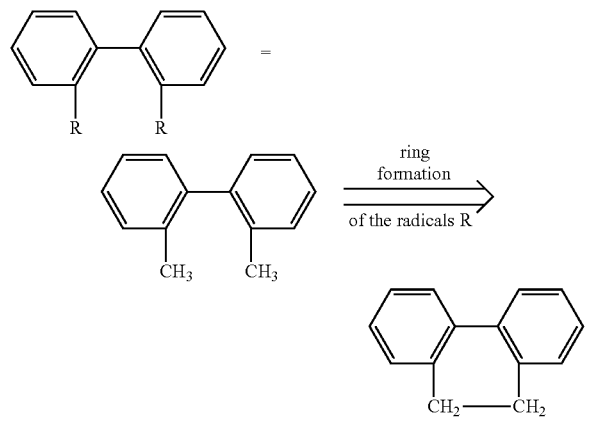

Furthermore, however, the above-mentioned formulation is also intended to be taken to mean that, in the case where one of the two radicals represents hydrogen, the second radical is bonded at the position at which the hydrogen atom was bonded, with formation of a ring. This is intended to be illustrated by the following scheme:

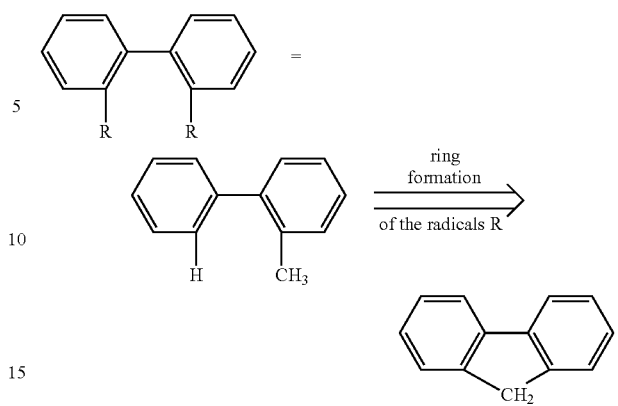

The matrix material M2 is preferably a compound containing at least one anthracene unit. It is preferably a 9,10-diarylanthracene compound which is optionally substituted by $R^3$.

M2 preferably conforms to the following formula (II)

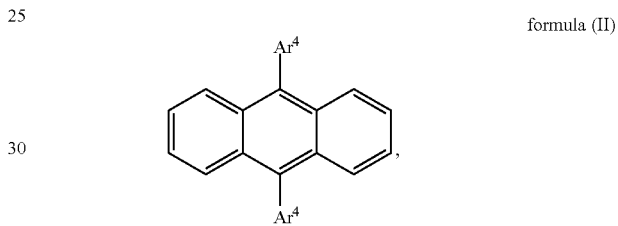

formula (II)

where:
Ar$^4$ is on each occurrence, identically or differently, an aromatic or heteroaromatic ring system having 5 to 40 aromatic ring atoms, which may be substituted by one or more radicals $R^3$; and
$R^3$ is on each occurrence, identically or differently, H, D, F, C(=O)R$^4$, CN, Si(R$^4$)$_3$, N(R$^4$)$_2$, P(=O)(R$^4$)$_2$, S(=O)R$^4$, S(=O)$_2$R$^4$, a straight-chain alkyl or alkoxy group having 1 to 20 C atoms or a branched or cyclic alkyl or alkoxy group having 3 to 20 C atoms or an alkenyl or alkynyl group having 2 to 20 C atoms, where the above-mentioned groups may each be substituted by one or more radicals R$^4$ and where one or more CH$_2$ groups in the above-mentioned groups may be replaced by —R$^4$C=CR$^4$—, —C≡C—, Si(R$^4$)$_2$, C=O, C=S, C=NR$^4$, —C(=O)O—, —C(=O)NR$^4$—, NR$^4$, P(=O)(R$^4$), —O—, —S—, SO or SO$_2$ and where one or more H atoms in the above-mentioned groups may be replaced by D, F or CN, or an aromatic or heteroaromatic ring system having 5 to 30 aromatic ring atoms, which may in each case be substituted by one or more radicals R$^4$, or an aryloxy or heteroaryloxy group having 5 to 30 aromatic ring atoms, which may be substituted by one or more radicals R$^4$, where two or more radicals R$^3$ may be linked to one another and may form a ring;
R$^4$ is on each occurrence, identically or differently, H, D, F or an aliphatic, aromatic or heteroaromatic organic radical having 1 to 20 C atoms, in which, in addition, one or more H atoms may be replaced by D or F; two or more substituents R$^4$ here may be linked to one another and may form a ring, and
the anthracene may be substituted at all free positions by a group R$^3$.

Ar⁴ is preferably selected on each occurrence, identically or differently, from aryl groups having 6 to 18 aromatic ring atoms, preferably 6 to 14 aromatic ring atoms, which may be substituted by one or more radicals R³.

M2 particularly preferably conforms to the formula (II-1)

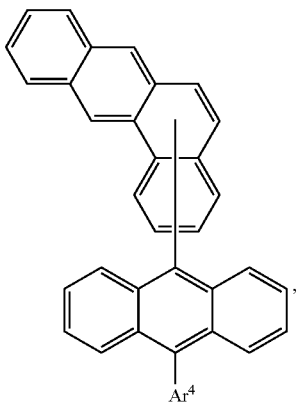

formula (II-1)

where Ar⁴ is as defined above and the benzanthracenyl group may be bonded to the anthracene in positions 1, 2, 3, 4, 5 or 6 and the benzanthracene and the anthracene may be substituted at all free positions by a group R³.

For the purposes of the application, the following numbering of the benzanthracene basic structure is used:

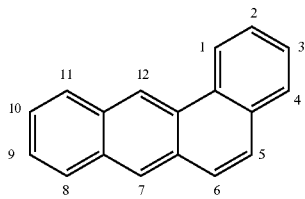 [SMILES: c1ccc2cc3c(ccc4ccccc43)cc2c1]

M2 furthermore particularly preferably conforms to the following formula (II-2)

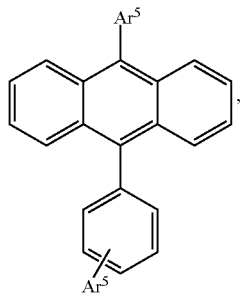

formula (II-2)

where
Ar⁵ is selected on each occurrence, identically or differently, from a condensed aryl or heteroaryl group having 10 to 18 aromatic ring atoms, which may be substituted by one or more radicals R³, and
the anthracene group and the phenylene group may be substituted at all free positions by a group R³.

Ar⁵ is preferably selected from naphthyl, anthracenyl, pyrenyl and fluoranthenyl groups, which may be substituted by one or more radicals R³.

Particularly preferred matrix materials M2 are the anthracene derivatives disclosed in WO 2006/097208, WO 2006/131192, WO 2007/065550, WO 2007/110129, WO 2007/065678, WO 2008/145239, WO 2009/100925, WO 2011/054442, and EP 1553154.

The matrix material M2 is furthermore preferably a compound containing at least one pyrene unit. M2 is particularly preferably a pyrene derivative which is substituted by at least one optionally substituted aromatic or heteroaromatic ring system having 6 to 30 aromatic ring atoms. M2 is very particularly preferably a pyrene derivative which is substituted by at least one, preferably at least two, aromatic ring systems having 6 to 24 aromatic ring atoms.

M2 is preferably selected from compounds of the formula (III)

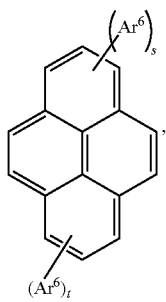

formula (III)

where:
Ar⁶ is an aromatic or heteroaromatic ring system having 5 to 40 aromatic ring atoms, which may be substituted by one or more radicals R⁵; and
R⁵ is on each occurrence, identically or differently, H, D, F, C(=O)R⁶, CN, Si(R⁶)₃, N(R⁶)₂, P(=O)(R⁶)₂, S(=O)R⁶, S(=O)₂R⁶, a straight-chain alkyl or alkoxy group having 1 to 20 C atoms or a branched or cyclic alkyl or alkoxy group having 3 to 20 C atoms or an alkenyl or alkynyl group having 2 to 20 C atoms, where the above-mentioned groups may each be substituted by one or more radicals R⁶ and where one or more CH₂ groups in the above-mentioned groups may be replaced by —R⁶C=CR⁶—, —C≡C—, Si(R⁶)₂, C=O, C=S, C=NR⁶, —C(=O)O—, —C(=O)NR—, NR⁶, P(=O)(R⁶), —O—, —S—, SO or SO₂ and where one or more H atoms in the above-mentioned groups may be replaced by D, F or CN, or an aromatic or heteroaromatic ring system having 5 to 30 aromatic ring atoms, which may in each case be substituted by one or more radicals R⁶, or an aryloxy or heteroaryloxy group having 5 to 30 aromatic ring atoms, which may be substituted by one or more radicals R⁶, where two or more radicals R⁵ may be linked to one another and may form a ring;
R⁶ is on each occurrence, identically or differently, H, D, F or an aliphatic, aromatic or heteroaromatic organic radical having 1 to 20 C atoms, in which, in addition, one or more H atoms may be replaced by D or F; two or more substituents R⁶ here may be linked to one another and may form a ring; and
s is 1, 2 or 3;
t is 0, 1, 2 or 3;

where the pyrene may be substituted at all free positions by radicals R⁵.

Particularly preferred matrix materials M2 are the pyrene compounds disclosed in EP 1749809, EP 1905754 and US 2012/0187826.

It is furthermore preferred for the dopant D to be a fluorescent emitting compound.

For the purposes of the present application, a fluorescent emitting compound is taken to mean a compound which has emission from a transition out of an excited singlet state.

The dopant D is preferably a small organic molecule having a molecular weight of 200 to 2000 Da, preferably 250 to 1500 Da and particularly preferably 300 to 1000 Da.

The dopant D is preferably not a polymeric compound.

The dopant D is preferably selected from compounds containing at least one substituted or unsubstituted condensed aryl group having 10 to 30 aromatic ring atoms. The dopant preferably carries at least one arylamino group.

The dopant D is preferably a compound of the following formula (IV-1)

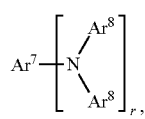

formula (IV-1)

where:
Ar⁷ is a condensed aryl group having 10 to 30 aromatic ring atoms, which may be substituted by one or more radicals R⁷;
Ar⁸ is an aromatic or heteroaromatic ring system having 6 to 30 aromatic ring atoms, which may be substituted by one or more radicals R⁷;
R⁷ is on each occurrence, identically or differently, H, D, F, C(=O)R⁸, CN, Si(R⁸)₃, N(R⁸)₂, P(=O)(R⁸)₂, S(=O)R⁸, S(=O)₂R⁸, a straight-chain alkyl or alkoxy group having 1 to 20 C atoms or a branched or cyclic alkyl or alkoxy group having 3 to 20 C atoms or an alkenyl or alkynyl group having 2 to 20 C atoms, where the above-mentioned groups may each be substituted by one or more radicals R⁸ and where one or more CH₂ groups in the above-mentioned groups may be replaced by —R⁸C=CR⁸—, —C≡C—, Si(R⁸)₂, C=O, C=S, C=NR⁸, —C(=O)O—, —C(=O)NR⁸—, NR⁸, P(=O)(R⁸), —O—, —S—, SO or SO₂ and where one or more H atoms in the above-mentioned groups may be replaced by D, F or CN, or an aromatic or heteroaromatic ring system having 5 to 30 aromatic ring atoms, which may in each case be substituted by one or more radicals R⁸, or an aryloxy or heteroaryloxy group having 5 to 30 aromatic ring atoms, which may be substituted by one or more radicals R⁸, where two or more radicals R⁷ may be linked to one another and may form a ring;
R⁸ is on each occurrence, identically or differently, H, D, F or an aliphatic, aromatic or heteroaromatic organic radical having 1 to 20 C atoms, in which, in addition, one or more H atoms may be replaced by D or F; two or more substituents R⁸ here may be linked to one another and may form a ring; and r is 1, 2, 3 or 4.

According to a preferred embodiment, r in formula (IV) is equal to 1 or 2.

Ar⁷ is preferably selected from the following groups:

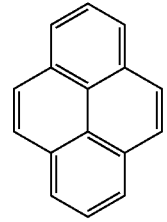

Ar⁷-1

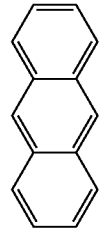

Ar⁷-2

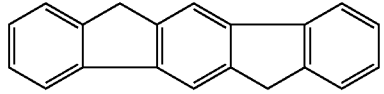

Ar⁷-3

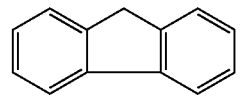

Ar⁷-4

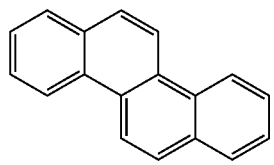

Ar⁷-5

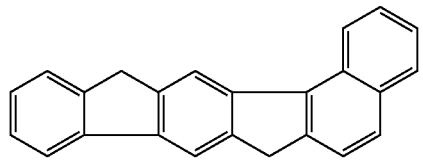

Ar⁷-6

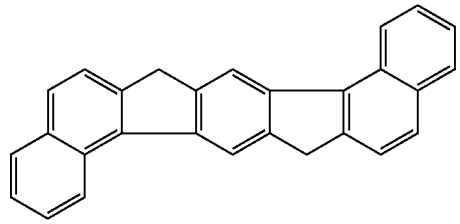

Ar⁷-7 where the groups may be substituted at all free positions by one or more radicals R⁷, and
where the groups of the formula Ar⁷-3 and Ar⁷-4 must contain at least one condensed-on aromatic ring which is condensed onto one of the six-membered rings.

The dopant D likewise preferably conforms to the following formula (IV-2)

Ar⁹       formula (IV-2)

where

Ar$^9$ is selected from condensed aryl groups having 14 to 30 aromatic ring atoms, which may be substituted by one or more radicals R$^7$, where R$^1$ is defined as above.

Ar$^9$ is preferably selected from condensed aryl groups having 14 to 20 aromatic ring atoms, which may be substituted by one or more radicals R$^7$.

Particularly preferred dopants D are the indenofluorenamines or indenofluorenediamines disclosed in WO 2006/108497 or WO 2006/122630, the benzoindenofluorenamines or benzoindenofluorenediamines disclosed in WO 2008/006449, the dibenzoindenofluorenamines or dibenzoindenofluorenediamines disclosed in WO 2007/140847, and the indenofluorene derivatives containing condensed aryl groups disclosed in WO 2010/012328. Particular preference is likewise given to the pyrenearylamines disclosed in WO 2012/048780 and the as yet unpublished EP 12004426.8.

Preference is likewise given to the benzoindenofluorenamines disclosed in the as yet unpublished EP 12006239.3.

The emitting layer of the electronic device according to the invention may comprise further compounds. Such further compounds are preferably present in proportions of not greater than 10% by vol., preferably of not greater than 5% by vol. and particularly preferably of not greater than 1% by vol. Very particularly preferably, no further compounds are present in the emitting layer.

The matrix material M1 is preferably present in the emitting layer in a proportion of 1-15% by vol., particularly preferably of 2-12% by vol., very particularly preferably of 3-10% by vol. and most preferably of 7-10% by vol.

The matrix material M2 is preferably present in the emitting layer in a proportion of 70 to 95% by vol., particularly preferably of 85 to 90% by vol.

The dopant D is preferably present in the emitting layer in a proportion of 0.5-10% by vol., particularly preferably 1-8% by vol. and very particularly preferably 2-6% by vol.

The emitting layer of the electronic device according to the invention furthermore preferably emits light having an emission maximum at a wavelength of 430-480 nm, preferably 435-470 nm, particularly preferably 440-460 nm.

The emitting layer of the electronic device according to the invention furthermore preferably emits light having CIE coordinates of x<0.25 and y<0.35, preferably of x<0.2 and y<0.3. Furthermore preferably, x>0.1 and y>0.

The invention furthermore relates to a formulation comprising at least one organic solvent, at least one dopant D, at least one matrix material M1 and at least one matrix material M2, where D, M1 and M2 are selected differently and where M1 is selected from monotriarylamines and M2 is selected from compounds containing at least one anthracene unit or from compounds containing at least one pyrene unit.

The formulation can be used in a process for the production of an electronic device. It is especially suitable for the production of the emitting layer of an electronic device, preferably of an OLED, by spin coating or by printing processes. The way in which such solutions can be prepared is known to the person skilled in the art and is described, for example, in WO 2002/072714, WO 2003/019694 and the literature cited therein.

Formulations can be, for example, solutions, dispersions or emulsions. It may be preferred to use mixtures of two or more solvents for this purpose. Suitable and preferred solvents are, for example, toluene, anisole, o-, m- or p-xylene, methyl benzoate, mesitylene, tetralin, veratrol, THF, methyl-THF, THP, chlorobenzene, dioxane, phenoxytoluene, in particular 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, methyl benzoate, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane or mixtures of these solvents.

For the formulation according to the invention, the preferences indicated above relating to the proportions of the compounds M1, M2 and D apply.

Furthermore, for the formulation according to the invention, the preferred embodiments indicated above for the compounds M1, M2 and D apply.

The electronic device according to the invention is preferably selected from organic integrated circuits (OICs), organic field-effect transistors (OFETs), organic thin-film transistors (OTFTs), organic light-emitting transistors (OLETs), organic solar cells (OSCs), organic optical detectors, organic photoreceptors, organic field-quench devices (OFQDs), organic light-emitting electrochemical cells (OLECs), organic laser diodes (O-lasers) and organic electroluminescent devices (OLEDs).

Apart from cathode, anode and the emitting layer, the device according to the invention may also comprise further layers. These are selected, for example, from in each case one or more hole-injection layers, hole-transport layers, hole-blocking layers, electron-transport layers, electron-injection layers, electron-blocking layers, exciton-blocking layers, interlayers, charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*) and/or organic or inorganic p/n junctions. However, it should be pointed out that each of these layers does not necessarily have to be present.

The sequence of the layers of the electronic device is preferably the following:
anode/hole-injection layer/hole-transport layer/emitting layer/electron-transport layer/electron-injection layer/cathode.

It should again be pointed out here that not all of the said layers have to be present, and/or that further layers may additionally be present.

The device according to the invention can emit blue or white light or light of another colour, even if its emitting layer emits blue light. This can be achieved through the presence of further emitting layers and/or layers which convert the colour of the emitted light.

The device according to the invention may comprise one or more further emitting layers. The emitting layers in this case particularly preferably have in total a plurality of emission maxima between 380 nm and 750 nm, resulting overall in white emission, i.e. various emitting compounds which are able to fluoresce or phosphoresce and which emit blue or yellow or orange or red light are used in the emitting layers. Preference is given to three-layer systems, i.e. systems having three emitting layers, where the three layers exhibit blue, green and orange or red emission, or two-layer systems, where the two layers exhibit blue and orange emission (for the basic structure see, for example, WO 2005/011013). According to a preferred embodiment, the blue-emitting layer is a fluorescent layer and the red-, orange-, green- or yellow-emitting layer(s) are phosphorescent.

For the purposes of the present application, fluorescence is taken to mean emission from a transition from an excited singlet state. Phosphorescence is taken to mean emission from a spin-forbidden transition, for example a transition from an excited triplet state or a state having a higher spin quantum number, for example a quintet state.

A fluorescent layer here is taken to mean a layer comprising a fluorescent emitter. Correspondingly, a phosphorescent layer is taken to mean a layer comprising a phosphorescent emitter.

Suitable phosphorescent emitters are, in particular, compounds which emit light, preferably in the visible region, on suitable excitation and in addition contain at least one atom having an atomic number greater than 20, preferably greater than 38 and less than 84, particularly preferably greater than 56 and less than 80. The phosphorescent dopants used are preferably compounds which contain copper, molybdenum, tungsten, rhenium, ruthenium, osmium, rhodium, iridium, palladium, platinum, silver, gold or europium, in particular compounds which contain iridium, platinum or copper.

For the purposes of the present invention, all luminescent iridium, platinum or copper complexes are regarded as phosphorescent compounds. Examples of the phosphorescent emitters described above are revealed by the applications WO 2000/70655, WO 2001/41512, WO 2002/02714, WO 2002/15645, EP 1191613, EP 1191612, EP 1191614, WO 2005/033244, WO 2005/019373 and US 2005/0258742.

Examples of fluorescent emitters the compounds indicated above as preferred embodiments of the dopant D.

Suitable charge-transport materials, as can be used in the hole-injection or hole-transport layer or electron-blocking layer or in the electron-transport layer of the organic electroluminescent device according to the invention, are, for example, the compounds disclosed in Y. Shirota et al., Chem. Rev. 2007, 107(4), 953-1010 or other materials as are employed in accordance with the prior art in these layers.

Materials which can be used for the electron-transport layer are all materials as are used in accordance with the prior art as electron-transport materials in the electron-transport layer. Particularly suitable are aluminium complexes, for example Alq3, zirconium complexes, for example Zrq4, benzimidazole derivatives, triazine derivatives, pyrimidine derivatives, pyridine derivatives, pyrazine derivatives, quinoxaline derivatives, quinoline derivatives, oxadiazole derivatives, aromatic ketones, lactams, boranes, diazaphosphole derivatives and phosphine oxide derivatives. Furthermore suitable materials are derivatives of the above-mentioned compounds, as disclosed in JP 2000/053957, WO 2003/060956, WO 2004/028217, WO 2004/080975 and WO 2010/072300.

Preferred hole-transport materials which can be used in a hole-transport, hole-injection or electron-blocking layer in the electroluminescent device according to the invention are indenofluorenamine derivatives (for example in accordance with WO 06/122630 or WO 06/100896), the amine derivatives disclosed in EP 1661888, hexaazatriphenylene derivatives (for example in accordance with WO 01/049806), amine derivatives containing condensed aromatic rings (for example in accordance with U.S. Pat. No. 5,061,569), the amine derivatives disclosed in WO 95/09147, monobenzoindenofluorenamines (for example in accordance with WO 08/006449), dibenzoindenofluorenamines (for example in accordance with WO 07/140847), spirobifluorenamines (for example in accordance with WO 2012/034627 or WO 2013/120577), fluorenamines (for example in accordance with the as yet unpublished applications EP 12005369.9, EP 12005370.7 and EP 12005371.5), spirodibenzopyranamines (for example in accordance with WO 2013/083216) and dihydroacridine derivatives (for example in accordance with WO 2012/150001).

It is preferred in accordance with the invention for the device according to the invention to comprise a hole-transport layer which is arranged on the anode side of the emitting layer, and which comprises one or more monotriarylamine compounds, as defined above. The same preferences apply here as apply to the monotriarylamine compound M1 of the emitting layer.

The cathode of the organic electroluminescent device preferably comprises metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). Also suitable are alloys comprising an alkali metal or alkaline-earth metal and silver, for example an alloy comprising magnesium and silver. In the case of multilayered structures, further metals which have a relatively high work function, such as, for example, Ag or Al, can also be used in addition to the said metals, in which case combinations of the metals, such as, for example, Ca/Ag, Mg/Ag or Ba/Ag, are generally used. It may also be preferred to introduce a thin interlayer of a material having a high dielectric constant between a metallic cathode and the organic semiconductor. Suitable for this purpose are, for example, alkali metal fluorides or alkaline-earth metal fluorides, but also the corresponding oxides or carbonates (for example LiF, $Li_2O$, $BaF_2$, MgO, NaF, CsF, $Cs_2CO_3$, etc.). Furthermore, lithium quinolinate (LiQ) can be used for this purpose. The layer thickness of this layer is preferably between 0.5 and 5 nm.

The anode preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. For some applications, at least one of the electrodes must be transparent or partially transparent in order to facilitate either irradiation of the organic material (organic solar cells) or the coupling-out of light (OLEDs, O-lasers). Preferred anode materials here are conductive mixed metal oxides. Particular preference is given to indium tin oxide (ITO) or indium zinc oxide (IZO). Preference is furthermore given to conductive, doped organic materials, in particular conductive doped polymers. Furthermore, the anode may also consist of a plurality of layers, for example of an inner layer of ITO and an outer layer of a metal oxide, preferably tungsten oxide, molybdenum oxide or vanadium oxide.

The device according to the invention is appropriately (depending on the application) structured, provided with contacts and finally sealed, since the lifetime of the devices according to the invention is shortened in the presence of water and/or air.

In a preferred embodiment, the device according to the invention is characterised in that one or more layers are coated by means of a sublimation process, in which the materials are applied by vapour deposition in vacuum sublimation units at an initial pressure of less than $10^{-5}$ mbar, preferably less than $10^{-6}$ mbar. However, it is also possible here for the initial pressure to be even lower, for example less than $10^{-7}$ mbar.

It is likewise preferred for one or more layers to be coated by means of the OVPD (organic vapour phase deposition) process or with the aid of carrier-gas sublimation, in which the materials are applied at a pressure of between $10^{-5}$ mbar and 1 bar. A special case of this process is the OVJP (organic vapour jet printing) process, in which the materials are applied directly through a nozzle and are thus structured (for example M. S. Arnold et al., *Appl. Phys. Lett.* 2008, 92, 053301).

It is furthermore preferred for one or more layers to be produced from solution, such as, for example, by spin coating, or by means of any desired printing process, such as, for example, screen printing, flexographic printing, nozzle printing or offset printing, but particularly preferably LITI (light induced thermal imaging, thermal transfer printing) or ink-jet printing. In particular, the emitting layer of the device according to the invention is preferably applied from solution. For this purpose, use is preferably made of one of the preferred formulations indicated above.

For the production of an organic electroluminescent device according to the invention, it is furthermore preferred for one or more layers to be applied from solution and for one or more layers to be applied by a sublimation process.

In accordance with the invention, the electronic devices comprising one or more compounds of the formula (I) can be employed in displays, as light sources in lighting applications and as light sources in medical and/or cosmetic applications (for example light therapy).

WORKING EXAMPLES

A) Production of the OLEDs

The results of various OLEDs are presented in the following Examples V1 to V7 and E1 to E7 (see Table 1 for structure of the device and Table 2 for data of the device). E denotes examples according to the invention, V denotes comparative examples.

Glass plates coated with structured ITO (indium tin oxide) in a thickness of 50 nm are wet-cleaned (dishwasher, Merck Extran detergent). For the HTL layer arrangements B and C (see below), these glass plates are treated with a UV ozone plasma, and, for improved processing, a 20 nm PEDOT: PSS layer is applied (poly(3,4-ethylenedioxythiophene) poly(styrenesulfonate), purchased as CLEVIOS™ P VP AI 4083 from Heraeus Clevios Deutschland, applied by spin coating from aqueous solution). For the HTL layer arrangement A, the glass plates are dried by heating at 250° C. for 15 min before application of the organic layers by vapour deposition and subsequently treated with an oxygen plasma.

The glass plates form the substrates to which the OLEDs are applied. The OLEDs have in principle the following layer structure: substrate/HTL layer arrangement/emission layer (EML)/electron-transport layer (ETL)/optional electron-injection layer (EIL) and finally a cathode. The cathode is formed by an aluminium layer with a thickness of 100 nm. The precise structure of the OLEDs is shown in Table 1. The materials required for the production of the OLEDs are shown in Table 3.

The HTL layer arrangement A consists, viewed from the substrate, of a 90 nm thick layer of material SpA2, 10 nm of HATCN, 30 nm of SpA2, 10 nm of HATCN and 20 nm of MA1.

The HTL layer arrangement B consists analogously of 140 nm of SpA1, 5 nm of HATCN and 20 nm of CbzA1.

The HTL layer arrangement C consists analogously of 140 nm of SpA1, 5 nm of HATCN and 20 nm of MA1.

All materials are applied by thermal vapour deposition in a vacuum chamber. The emission layer here always consists of at least one matrix material (host material) and an emitting dopant (emitter), which is admixed with the matrix material or matrix materials in a certain proportion by volume by coevaporation. An expression such as M1:CbzA1:D1 (89%:8%:3%) here means that the material M1 is present in the layer in a proportion by volume of 89%, CbzA1 is present in the layer in a proportion of 8% and D1 is present in the layer in a proportion of 3%.

The OLEDs are characterised by standard methods. For this purpose, the electroluminescence spectra, the current efficiency (measured in cd/A), the power efficiency (measured in lm/W) and the external quantum efficiency (EQE, measured in percent) as a function of the luminous density, calculated from current/voltage/luminous density characteristic lines (IUL characteristic lines) assuming Lambert emission characteristics, and the lifetime are determined. The electroluminescence spectra are determined at a luminous density of 1000 cd/m$^2$, and the CIE 1931 x and y colour coordinates are calculated therefrom. The expression U1000 in Table 2 denotes the voltage necessary for a luminous density of 1000 cd/m$^2$. CE1000 and PE1000 denote the current and power efficiency respectively which are achieved at 1000 cd/m$^2$. Finally, EQE1000 denotes the external quantum efficiency at an operating luminous density of 1000 cd/m$^2$. The lifetime LT is defined as the time after which the luminous density drops from the initial luminous density L0 to a certain proportion L1 on operation at constant current. An expression of L0=6000 cd/m$^2$ and L1=70% in Table 2 means that the lifetime indicated in column LT corresponds to the time after which the initial luminous density drops from 6000 cd/m$^2$ to 4200 cd/m$^2$.

The data of the various OLEDs are summarised in Table 2. Example V1-V7 are comparative examples in accordance with the prior art, Examples E1-E7 show data of OLEDs having a structure according to the invention.

As can be seen from the table, significantly better values for voltage, but in particular also efficiency and lifetime, are obtained with triarylmonoamines (compounds MA1 and MA2) as additional component in the emission layer compared with amine compounds containing two or more arylamine groups (compounds CbzA1, SpA1, NPB).

This effect is achieved with various dopants, as shown by the examples with various dopants (amine-free pyrene emitter, monobenzoindenofluorenamine D2, perylene derivative TBP).

TABLE 1

Structure of the OLEDs

| Ex. | HTL stack | EML Thickness | ETL Thickness | EIL Thickness |
|---|---|---|---|---|
| V1 | A | M1:CbzA1:D1 (89%:8%:3%) 20 nm | ST1:LiQ (50%:50%) 30 nm | — |

TABLE 1-continued

Structure of the OLEDs

| Ex. | HTL stack | EML Thickness | ETL Thickness | EIL Thickness |
|---|---|---|---|---|
| V2 | B | M1:CbzA1:D2 (90%:5%:5%) 30 nm | ST1:LiQ (50%:50%) 20 nm | LiQ 1 nm |
| V3 | B | M1:SpA1:D2 (90%:5%:5%) 30 nm | ST1:LiQ (50%:50%) 20 nm | LiQ 1 nm |
| V4 | C | M1:CbzA1:D2 (90%:5%:5%) 30 nm | ST1:LiQ (50%:50%) 20 nm | LiQ 1 nm |
| V5 | C | M1:SpA1:D2 (90%:5%:5%) 30 nm | ST1:LiQ (50%:50%) 20 nm | LiQ 1 nm |
| V6 | C | M1:NPB:D2 (90%:5%:5%) 30 nm | ST1:LiQ (50%:50%) 20 nm | LiQ 1 nm |
| V7 | C | M1:NPB:TBP (91%:7%:2%) 30 nm | ST1:LiQ (50%:50%) 20 nm | LiQ 1 nm |
| E1 | A | M1:MA1:D1 (89%:8%:3%) 20 nm | ST1:LiQ (50%:50%) 30 nm | — |
| E2 | B | M1:MA1:D2 (90%:5%:5%) 30 nm | ST1:LiQ (50%:50%) 20 nm | LiQ 1 nm |
| E3 | B | M1:MA2:D2 (90%:5%:5%) 30 nm | ST1:LiQ (50%:50%) 20 nm | LiQ 1 nm |
| E4 | C | M1:MA1:D2 (90%:5%:5%) 30 nm | ST1:LiQ (50%:50%) 20 nm | LiQ 1 nm |
| E5 | C | M1:MA2:D2 (90%:5%:5%) 30 nm | ST1:LiQ (50%:50%) 20 nm | LiQ 1 nm |
| E6 | C | M1:MA1:TBP (91%:7%:2%) 30 nm | ST1:LiQ (50%:50%) 20 nm | LiQ 1 nm |
| E7 | C | M1:MA2:TBP (91%:7%:2%) 30 nm | ST1:LiQ (50%:50%) 2 nm | LiQ 1 nm |

TABLE 2

Data of the OLEDs

| Ex. | U1000 (V) | CE1000 (cd/A) | PE1000 (lm/W) | EQE 1000 | CIE x/y at 1000 cd/m² | L0 | L1 % | LT (h) |
|---|---|---|---|---|---|---|---|---|
| V1 | 5.5 | 6.3 | 3.6 | 6.3% | 0.14/011 | 6000 cd/m² | 70 | 140 |
| V2 | 4.5 | 8.0 | 5.6 | 7.4% | 0.14/0.13 | 6000 cd/m² | 70 | 170 |
| V3 | 4.8 | 5.7 | 3.7 | 4.2% | 0.15/0.18 | 6000 cd/m² | 70 | 60 |
| V4 | 4.4 | 8.4 | 6.0 | 7.7% | 0.14/0.13 | 6000 cd/m² | 70 | 180 |
| V5 | 4.8 | 6.0 | 4.0 | 4.5% | 0.15/0.17 | 6000 cd/m² | 70 | 55 |
| V6 | 4.2 | 7.5 | 5.5 | 6.8% | 0.15/0.14 | 6000 cd/m² | 70 | 150 |
| V7 | 4.5 | 9.2 | 4.5 | 6.0% | 0.14/0.21 | 6000 cd/m² | 70 | 130 |
| E1 | 5.3 | 6.6 | 3.9 | 6.9% | 0.15/0.10 | 6000 cd/m² | 70 | 200 |
| E2 | 4.5 | 8.6 | 6.1 | 7.9% | 0.14/0.13 | 6000 cd/m² | 70 | 190 |
| E3 | 4.5 | 8.5 | 5.9 | 7.8% | 0.14/0.13 | 6000 cd/m² | 70 | 185 |
| E4 | 4.4 | 8.6 | 6.1 | 8.0% | 0.14/0.13 | 6000 cd/m² | 70 | 220 |
| E5 | 4.3 | 8.7 | 6.3 | 8.1% | 0.14/0.13 | 6000 cd/m² | 70 | 235 |
| E6 | 4.3 | 10 | 7.2 | 6.7% | 0.14/0.20 | 6000 cd/m² | 70 | 180 |
| E7 | 4.4 | 9.9 | 7.1 | 6.9% | 0.14/0.20 | 6000 cd/m² | 70 | 195 |

TABLE 3

Structural formulae of the materials for the OLEDs

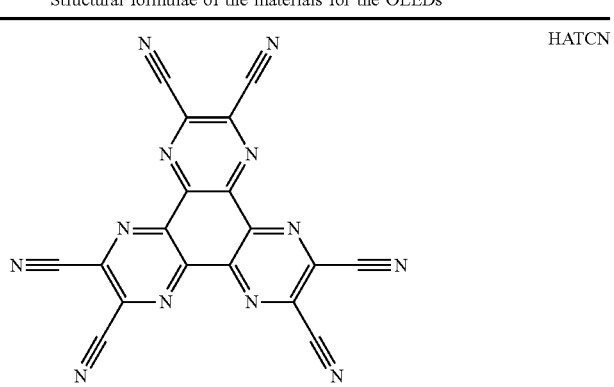

HATCN

TABLE 3-continued
Structural formulae of the materials for the OLEDs
SpA1
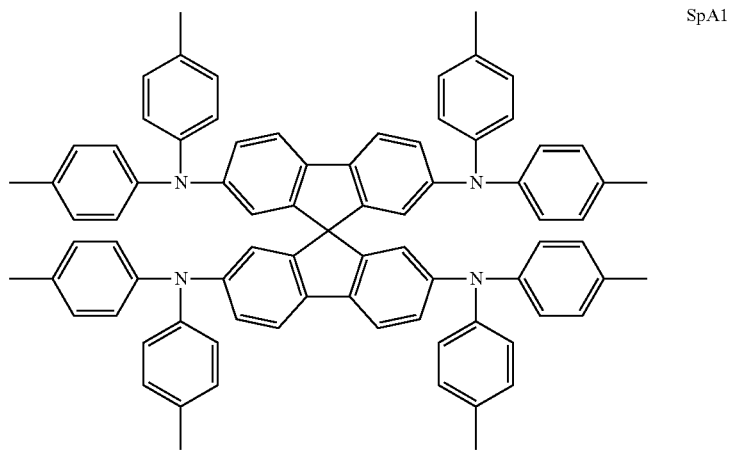
NPB
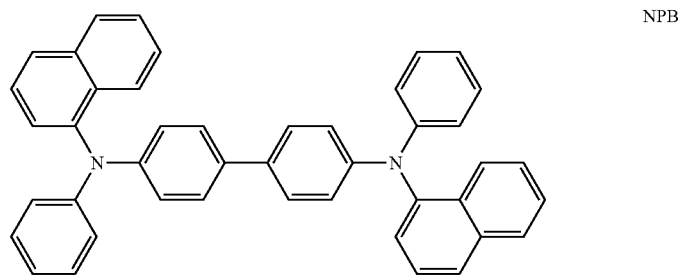
SpA2
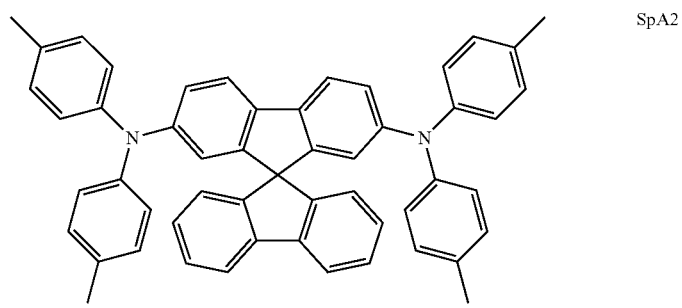
M1
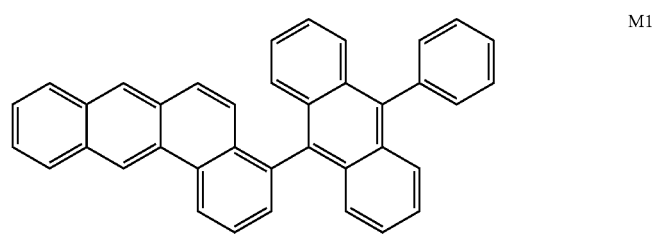
D1
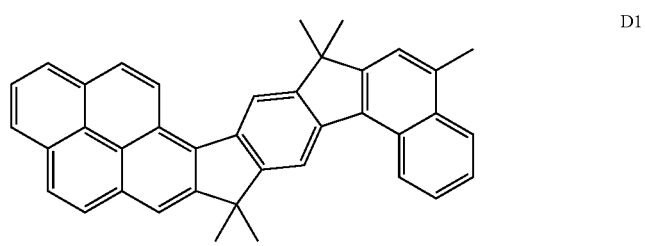

TABLE 3-continued
Structural formulae of the materials for the OLEDs
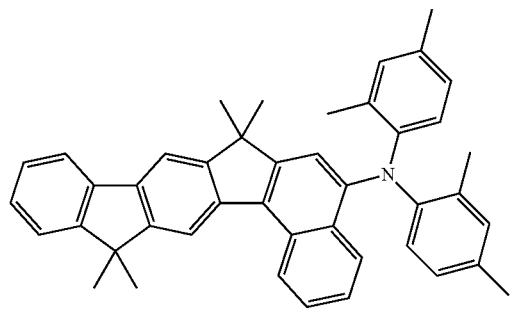 [SMILES: Cc1ccc(N(c2ccc(C)cc2C)c2cc3c(c4ccccc24)-c2cc4c(cc2C3(C)C)-c2ccccc2C4(C)C)c(C)c1]
D2
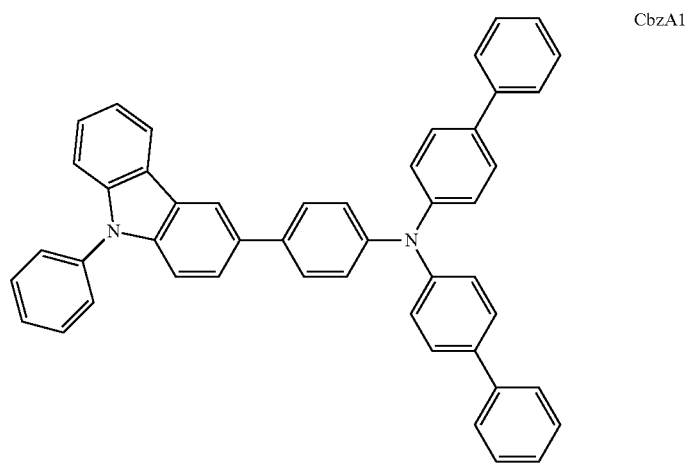
CbzA1
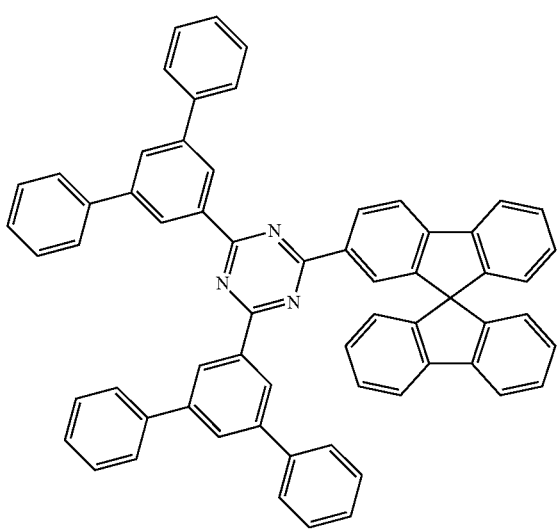 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1]
ST1
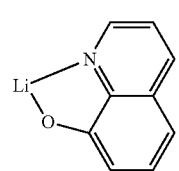
LiQ

TABLE 3-continued

Structural formulae of the materials for the OLEDs

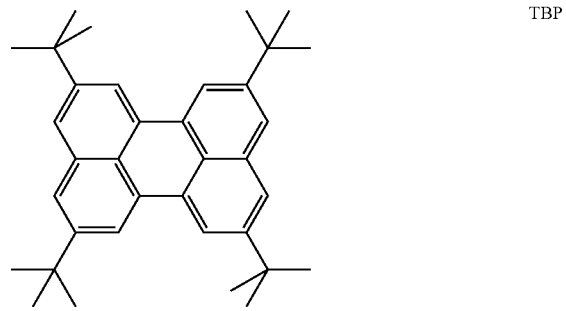
TBP

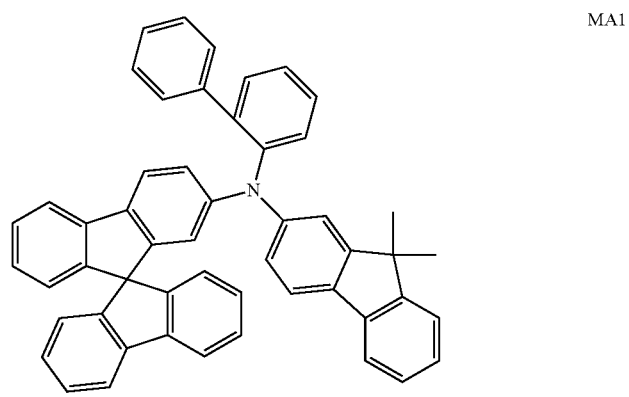
MA1

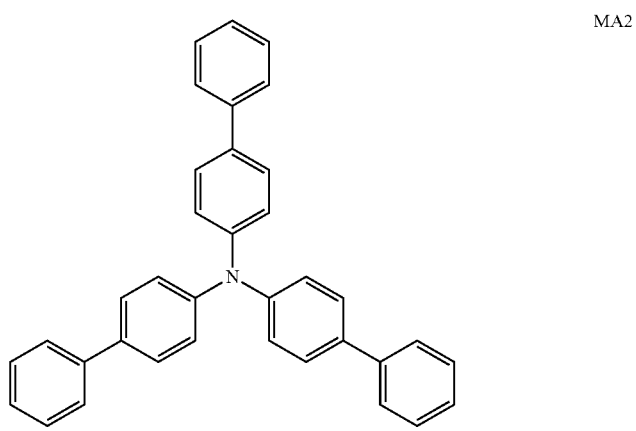
MA2

The invention claimed is:

1. An electronic device comprising an anode, a cathode, and at least one emitting layer, wherein the emitting layer comprises at least one dopant D, wherein the D is a fluorescent emitting compound, at least one matrix material M1, and at least one matrix material M2, wherein the D, the M1, and the M2 are different, wherein the M1 is a mono-triarylamine selected from the group consisting of formulae (I-2) through (I-4):

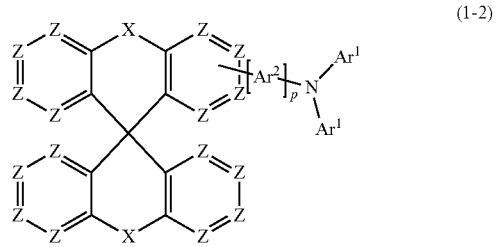
(1-2)

-continued (1-3)

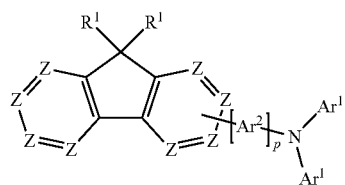

(1-4)

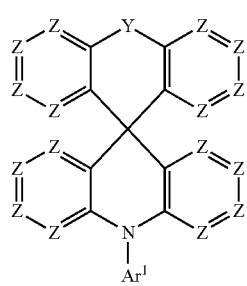

wherein

Z is on each occurrence, identically or differently, N or $CR^1$, wherein Z is C if a substituent is bonded;

X is on each occurrence, identically or differently, a single bond, O, S, Se, $BR^1$, $C(R^1)_2$, $Si(R^1)_2$, $NR^1$, $PR^1$, $C(R^1)_2$-$C(R^1)^2$, or $CR^1$=$CR^{1;}$ Y is a single bond, O, S, Se, $BR^1$, $C(R^1)_2$, $Si(R^1)^2$, $NR^1$, $PR^1$, $C(R^1)_2$-$C(R^1)^2$, or $CR^1$=$CR^1$;

$Ar^1$ is on each occurrence, identically or differently, an aromatic or heteroaromatic ring system having 5 to 50 aromatic ring atoms, which is optionally substituted by one or more radicals $R^1$;

$R^1$ is on each occurrence, identically or differently, H, D, F, C(=O)$R^2$, CN, $Si(R^2)_3$, P(=O)$(R^2)_2$, S(=O)$R^2$, S(=O)$_2R^2$, a straight-chain alkyl or alkoxy group having 1 to 20 C atoms or a branched or cyclic alkyl or alkoxy group having 3 to 20 C atoms or an alkenyl or alkynyl group having 2 to 20 C atoms, wherein the above-mentioned groups are optionally substituted by one or more radicals $R^2$ and wherein one or more $CH_2$ groups in the above-mentioned groups are optionally replaced by —$R^2$C=$CR^2$—, —C≡C—, $Si(R^2)_2$, C=O, C=S, C=$NR^2$, —C(=O)O—, —C(=O)$NR^2$—, P(=O)$(R^2)$, —O—, —S—, SO, or $SO_2$ and wherein one or more H atoms in the above-mentioned groups is optionally replaced by D, F or CN, or an aromatic or heteroaromatic ring system having 5 to 30 aromatic ring atoms, which in each case is optionally substituted by one or more radicals $R^2$, or an aryloxy or heteroaryloxy group having 5 to 30 aromatic ring atoms, which is optionally substituted by one or more radicals $R^2$;

$R^2$ is on each occurrence, identically or differently, H, D, F, or an aliphatic, aromatic, or heteroaromatic organic radical having 1 to 20 C atoms, wherein one or more H atoms are optionally replaced by D or F;

p is 0 or 1 and m and n
are, identically or differently, 0 or 1, wherein the sum of m and n is equal to 1 or 2; and wherein M2 is a compound of formula (II-1):

(II-1)

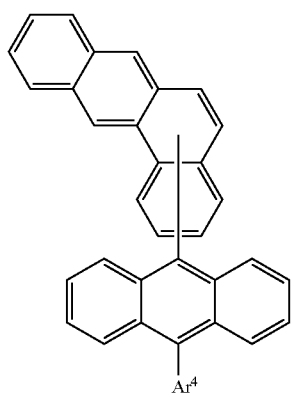

wherein the benzanthracenyl group is bonded to the anthracene in positions 1, 2, 3, 4, 5, or 6 and the benzanthracene and the anthracene are optionally substituted at all free positions by a group $R^3$;

$Ar^4$ is on each occurrence, identically or differently, an aromatic or heteroaromatic ring system having 5 to 40 aromatic ring atoms, which is optionally substituted by one or more radicals $R^3$;

$R^3$ is on each occurrence, identically or differently, H, D, F, C(=O)$R^4$, CN, $Si(R^4)_3$, $N(R^4)_2$, P(=O)$(R^4)_2$, S(=O)$R^4$, S(=O)$_2R^4$, a straight-chain alkyl or alkoxy group having 1 to 20 C atoms or a branched or cyclic alkyl or alkoxy group having 3 to 20 C atoms or an alkenyl or alkynyl group having 2 to 20 C atoms, wherein the above-mentioned groups are each optionally substituted by one or more radicals $R^4$ and wherein one or more $CH_2$ groups in the above-mentioned groups are optionally replaced by —$R^4$C=$CR^4$—, —C≡C—, $Si(R^4)_2$, C=O, C=S, C=$NR^4$, —C(=O)O—, —C(=O)$NR^4$—, $NR^4$, P(=O)$(R^4)$, —O—, —S—, SO, or $SO_2$ and wherein one or more H atoms in the above-mentioned groups are optionally replaced by D, F, or CN, or an aromatic or heteroaromatic ring system having 5 to 30 aromatic ring atoms, which in each case is optionally substituted by one or more radicals $R^4$, or an aryloxy or heteroaryloxy group having 5 to 30 aromatic ring atoms, which is optionally substituted by one or more radicals $R^4$, and wherein two or more radicals $R^3$ are optionally linked to one another so as to define a ring;

$R^4$ is on each occurrence, identically or differently, H, D, F, or an aliphatic, aromatic or heteroaromatic organic radical having 1 to 20 C atoms, in which, in addition, one or more H atoms may be replaced by D or F; two or more substituents $R^4$ here may be linked to one another and may form a ring.

2. The electronic device of claim 1, wherein the emitting layer of the device emits light having an emission maximum at a wavelength of 430 nm to 480 nm.

3. The electronic device of claim 1, wherein a hole-transporting layer comprising one or more monotriarylamine compounds is present on the anode side of the emitting layer.

4. The electronic device of claim 1, wherein the D is present in the emitting layer in a proportion of 0.5 to 10% by volume.

5. The electronic device of claim 1, wherein the M1 is present in the emitting layer in a proportion of 1 to 15% by volume.

6. The electronic device of claim 1, wherein the Ar$^1$ contains no condensed aryl or heteroaryl group having more than 10 aromatic ring atoms.

7. The electronic device of claim 1, wherein the electronic device is selected from the group consisting of organic integrated circuits, organic field-effect transistors, organic thin-film transistors, organic light-emitting transistors, organic solar cells, organic optical detectors, organic photoreceptors, organic field-quench devices, organic light-emitting electrochemical cells, organic laser diodes, and organic electroluminescent devices.

8. The electronic device of claim 1, wherein the emitting layer is applied from solution.

9. A display, a light source in lighting applications, or a light source in medical and/or cosmetic applications comprising the electronic device of claim 1.

10. A formulation comprising at least one organic solvent, at least one dopant D, wherein the D is a fluorescent emitting compound, at least one matrix material M1, and at least one matrix material M2, wherein the D, the M1, and the M2 are different, and wherein the M1 is a monotriarylamine selected from the group consisting of formulae (I-2) through (I-4):

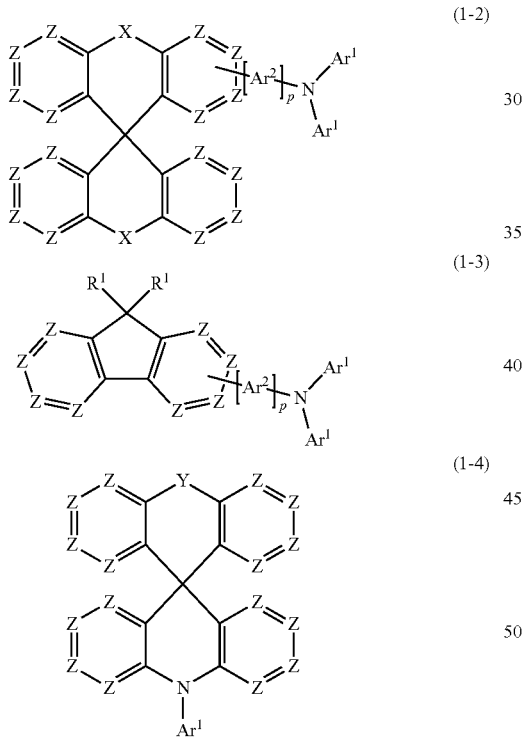

wherein
Z is on each occurrence, identically or differently, N or CR$^1$, wherein Z is C if a substituent is bonded;
X is on each occurrence, identically or differently, a single bond, O, S, Se, BR$^1$, C(R$^1$)$_2$, Si(R$^1$)$_2$, NR$^1$, PR$^1$, C(R$^1$)$_2$-C(R$^1$)$_2$, or CR$^1$=CR$^1$;
Y is a single bond, O, S, Se, BR$^1$, C(R$^1$)$_2$, Si(R$^1$)$_2$, NR$^1$, PR$^1$, C(R$^1$)$_2$-C(R$^1$)$_2$, or CR$^1$=CR$^1$.
Ar$^1$ is on each occurrence, identically or differently, an aromatic or heteroaromatic ring system having 5 to 50 aromatic ring atoms, which is optionally substituted by one or more radicals R$^1$;

R$^1$ is on each occurrence, identically or differently, H, D, F, C(=O)R$^2$, CN, Si(R$^2$)$_3$, P(=O)(R$^2$)$_2$, S(=O)R$^2$, S(=O)$_2$R$^2$, a straight-chain alkyl or alkoxy group having 1 to 20 C atoms or a branched or cyclic alkyl or alkoxy group having 3 to 20 C atoms or an alkenyl or alkynyl group having 2 to 20 C atoms, wherein the above-mentioned groups are optionally substituted by one or more radicals R$^2$, and wherein one or more CH$_2$ groups in the above-mentioned groups are optionally replaced by —R$^2$C=CR$^2$—, —C≡C—, Si(R$^2$)$_2$, C=O, C=S, C=NR$^2$, —C(=O)O—, —C(=O)NR$^2$—, P(=O)(R$^2$), —O—, —S—, SO, or SO$_2$, and wherein one or more H atoms in the above-mentioned groups is optionally replaced by D, F, or CN, an aromatic or heteroaromatic ring system having 5 to 30 aromatic ring atoms, which is each case is optionally substituted by one or more radicals R$^2$, or an aryloxy or heteroaryloxy group having 5 to 30 aromatic ring atoms, which is optionally substituted by one or more radicals R$^2$;
R$^2$ is on each occurrence, identically or differently, H, D, F, or an aliphatic, aromatic, or heteroaromatic organic radical having 1 to 20 C atoms, wherein one or more H atoms are optionally replaced by D or F;
p is 0 or 1; and
m and n
are, identically or differently, 0 or 1, wherein the sum of m and n is equal to 1 or 2; and
wherein M2 is a compound of formula (II-1):

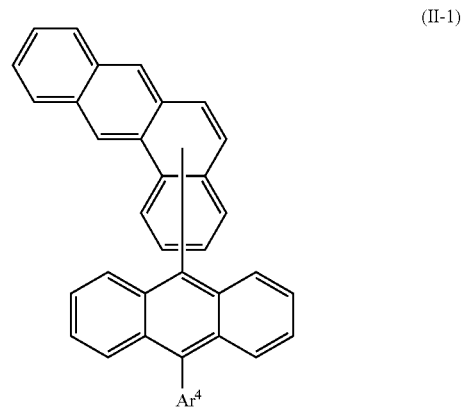

wherein
the benzanthracenyl group is bonded to the anthracene in positions 1, 2, 3, 4, 5, or 6 and the benzanthracene and the anthracene are optionally substituted at all free positions by a group R$^3$;
Ar$^4$ is on each occurrence, identically or differently, an aromatic or heteroaromatic ring system having 5 to 40 aromatic ring atoms, optionally substituted by one or more radicals R$^3$;
R$^3$ is on each occurrence, identically or differently, H, D, F, C(=O)R$^4$, CN, Si(R$^4$)$_3$, N(R$^4$)$_2$, P(=O)(R$^4$)$_2$, S(=O)R$^4$, S(=O)$_2$R$^4$, a straight-chain alkyl or alkoxy group having 1 to 20 C atoms or a branched or cyclic alkyl or alkoxy group having 3 to 20 C atoms or an alkenyl or alkynyl group having 2 to 20 C atoms, wherein the above-mentioned groups are optionally substituted by one or more radicals R$^4$, and wherein one or more CH$_2$ groups in said groups are optionally replaced by —R$^4$C=CR$^4$—, —C≡C—, Si(R$^4$)$_2$, C=O, C=S, C=NR$^4$, —C(=O)O—, —C(=O)NR$^4$—, NR$^4$, P(=O)(R$^4$), —O—, —S—, SO, or SO$_2$, and wherein one or more H atoms in the above-mentioned groups are optionally replaced by D, F, or CN, or an aromatic or heteroaromatic ring system having 5 to 30 aromatic ring atoms, which is each case is optionally substituted by one or more radicals R$^4$, or an aryloxy or heteroarloxy group having 5 to 30 aromatic ring atoms, which is optionally substituted by one or more radicals R$^4$, and wherein two or more radicals R$^3$ are optionally linked to one another so as it define a ring;

R$^4$ is on each occurrence, identically or differently, H, D, F, or an aliphatic, aromatic, or heteroaromatic organic radical having 1 to 20 C atoms, in which, in addition, one or more H atoms is optionally replaced by D or F; two or more substituents R$^4$ here may be linked to one another and may form a ring.

11. An organic electroluminescent device comprising the formulation of claim 10.

* * * * *